United States Patent
Wang et al.

(10) Patent No.: US 12,453,239 B2
(45) Date of Patent: Oct. 21, 2025

(54) DISPLAY PANEL AND METHOD FOR MANUFACTURING THE SAME, AND DISPLAY DEVICE

(71) Applicant: BOE TECHNOLOGY GROUP CO., LTD., Beijing (CN)

(72) Inventors: Chunyang Wang, Beijing (CN); Xueyan Tian, Beijing (CN); Ming Liu, Beijing (CN); Jing Wang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 78 days.

(21) Appl. No.: 17/763,700

(22) PCT Filed: Mar. 25, 2021

(86) PCT No.: PCT/CN2021/083089
§ 371 (c)(1),
(2) Date: Mar. 25, 2022

(87) PCT Pub. No.: WO2022/198592
PCT Pub. Date: Sep. 29, 2022

(65) Prior Publication Data
US 2024/0057376 A1 Feb. 15, 2024

(51) Int. Cl.
*H10K 50/856* (2023.01)
*H10K 50/85* (2023.01)
(Continued)

(52) U.S. Cl.
CPC ......... *H10K 50/856* (2023.02); *H10K 50/85* (2023.02); *H10K 50/858* (2023.02);
(Continued)

(58) Field of Classification Search
CPC .... H10K 50/856; H10K 50/85; H10K 50/858; H10K 59/1201; H10K 59/35;
(Continued)

(56) References Cited

U.S. PATENT DOCUMENTS

| | | | |
|---|---|---|---|
| 6,975,453 B1 | 12/2005 | Lippens et al. | |
| 2009/0101192 A1 | 4/2009 | Kothari et al. | |

(Continued)

FOREIGN PATENT DOCUMENTS

| | | |
|---|---|---|
| CN | 105954947 | 9/2016 |
| CN | 108476563 | 8/2018 |
| CN | 111900189 | 11/2020 |

OTHER PUBLICATIONS

Extended European Search Report for EP Application No. 21932217.9, dated Jul. 12, 2023, 8 pages.

*Primary Examiner* — James R Greece
*Assistant Examiner* — Jose M Diaz
(74) *Attorney, Agent, or Firm* — Dority & Manning, P.A.

(57) ABSTRACT

A display panel includes a substrate, a light-emitting structure layer, a specular reflection layer and an interference adjustment layer. The light-emitting structure layer is located on a side of the substrate. The light-emitting structure layer has a plurality of light-emitting regions and a non-light-emitting region for spacing the plurality of light-emitting regions apart from each other. The specular reflection layer is located on a side of the light-emitting structure layer away from the substrate. The specular reflection layer covers at least the non-light-emitting region. The interference adjustment layer is located on a side of the specular reflection layer away from the light-emitting structure layer. The interference adjustment layer is configured such that lights of some colors interfere destructively to form a mirror display of a set color.

20 Claims, 12 Drawing Sheets

(51) Int. Cl.
    *H10K 50/858*     (2023.01)
    *H10K 59/12*     (2023.01)
    *H10K 59/35*     (2023.01)
    *H10K 59/80*     (2023.01)
    *H10K 102/00*     (2023.01)

(52) U.S. Cl.
    CPC ......... *H10K 59/1201* (2023.02); *H10K 59/35* (2023.02); *H10K 59/872* (2023.02); *H10K 59/8722* (2023.02); *H10K 59/875* (2023.02); *H10K 59/878* (2023.02); *H10K 59/871* (2023.02); *H10K 59/873* (2023.02); *H10K 2102/351* (2023.02)

(58) Field of Classification Search
    CPC ............. H10K 59/872; H10K 59/8722; H10K 59/873; H10K 59/871; H10K 59/878; H10K 59/875; H10K 2102/351
    See application file for complete search history.

(56) References Cited

U.S. PATENT DOCUMENTS

| | | |
|---|---|---|
| 2010/0297365 A1 | 11/2010 | Curd |
| 2017/0222187 A1 | 8/2017 | Kim |
| 2020/0012180 A1 | 1/2020 | Schiavoni et al. |
| 2021/0395879 A1 | 12/2021 | Zhang et al. |
| 2022/0376209 A1* | 11/2022 | Tian .................... H10K 50/858 |

\* cited by examiner

DISPLAY PANEL AND METHOD FOR MANUFACTURING THE SAME, AND DISPLAY DEVICE

CROSS-REFERENCE TO RELATED APPLICATION

This application is a national phase entry under 35 USC 371 of International Patent Application No. PCT/CN 2021/083089 filed on Mar. 25, 2021, which is incorporated herein by reference in its entirety.

TECHNICAL FIELD

The present disclosure relates to the field of display technologies, and in particular, to a display panel and a method for manufacturing the same, and a display device.

BACKGROUND

With the rapid development of display technologies, various new technologies are constantly emerging, and a display device has diversified functions. For example, a mirror display device has both an image display function and a mirror imaging function, and is able to meet various needs of people, and the application thereof is increasingly wide.

SUMMARY

In an aspect, a display panel is provided. The display panel includes a substrate, a light-emitting structure layer, a specular reflection layer and an interference adjustment layer. The light-emitting structure layer is located on a side of the substrate. The light-emitting structure layer has a plurality of light-emitting regions and a non-light-emitting region for spacing the plurality of light-emitting regions apart from each other. The specular reflection layer is located on a side of the light-emitting structure layer away from the substrate. The specular reflection layer covers at least the non-light-emitting region. The interference adjustment layer is located on a side of the specular reflection layer away from the light-emitting structure layer. The interference adjustment layer is configured such that lights of some colors interfere destructively to form a mirror display of a set color.

In some embodiments, the interference adjustment layer includes: at least two first refractive index layers that are stacked; and a second refractive index layer located between every two adjacent first refractive index layers. A refractive index of the second refractive index layer is greater than a refractive index of the first refractive index layers.

In some embodiments, a material of the first refractive index layers includes silicon dioxide or magnesium fluoride, and/or a material of the second refractive index layer includes metal.

In some embodiments, a thickness of the first refractive index layers is in any one of a range of a difference between 135 nm and 5 nm to a sum of 135 nm and 5 nm, a range of a difference between 155 nm and 5 nm to a sum of 155 nm and 5 nm, a range of a difference between 170 nm and 5 nm to a sum of 170 nm and 5 nm, a range of a difference between 195 nm and 5 nm to a sum of 195 nm and 5 nm, a range of a difference between 210 nm and 5 nm to a sum of 210 nm and 5 nm, a range of a difference between 225 nm and 5 nm to a sum of 225 nm and 5 nm or a range of a difference between 240 nm and 5 nm to a sum of 240 nm and 5 nm. A thickness of the second refractive index layer is in a range of a difference between 4 nm and 1 nm to a sum of 4 nm and 1 nm.

In some embodiments, the interference adjustment layer is of a single-layer structure. A material of the interference adjustment layer includes at least one of tantalum metal and molybdenum oxide. Alternatively, a material of the interference adjustment layer includes at least one of molybdenum dioxide, ferric oxide and indium oxide. Alternatively, a material of the interference adjustment layer includes at least one of niobium carbide and zinc oxide.

In some embodiments, the interference adjustment layer is configured such that for a light with a wavelength of 550 nm, a refractive index of the interference adjustment layer is in a range of 2.3 to 2.6, inclusive, and an extinction coefficient of the interference adjustment layer is in a range of 0.57 to 0.77, inclusive.

In some embodiments, a thickness of the interference adjustment layer is in any one of a range of a difference between 35 nm and 5 nm to a sum of 35 nm and 5 nm, a range of a difference between 45 nm and 5 nm to a sum of 45 nm and 5 nm or a range of a difference between 55 nm and 5 nm to a sum of 55 nm and 5 nm.

In some embodiments, a thickness of the interference adjustment layer is in a range of a difference between 15 nm and 1 nm to a sum of 15 nm and 1 nm. The display panel further includes a light transmission adjustment layer located between the specular reflection layer and the interference adjustment layer. A thickness of the light transmission adjustment layer is in any one of a range of a difference between 25 nm and 2 nm to a sum of 25 nm and 2 nm, a range of a difference between 33 nm and 2 nm to a sum of 33 nm and 2 nm, or a range of a difference between 50 nm and 2 nm to a sum of 50 nm and 2 nm.

In some embodiments, the interference adjustment layer includes a plurality of first openings for exposing the plurality of light-emitting regions.

In some embodiments, a thickness of the specular reflection layer is in a range of a difference between 330 nm and 5 nm to a sum of 330 nm and 5 nm.

In some embodiments, the specular reflection layer is a transflective layer, and the specular reflection layer further covers the plurality of light-emitting regions. Alternatively, the specular reflection layer is a metal reflection layer, and the metal reflection layer includes a plurality of second openings for exposing the plurality of light-emitting regions.

In some embodiments, the display panel further includes an encapsulation layer, a protective cover plate and an optical adhesive layer. The encapsulation layer is located between the light-emitting structure layer and the specular reflection layer. The encapsulation layer is configured to encapsulate the light-emitting structure layer on the substrate. The protective cover plate is located on a side of the interference adjustment layer away from the specular reflection layer. The protective cover plate is configured to protect the interference adjustment layer, the specular reflection layer and the light-emitting structure layer. The optical adhesive layer is located between the interference adjustment layer and the protective cover plate. The optical adhesive layer is configured to adhere the protective cover plate to a surface of the interference adjustment layer away from the specular reflection layer.

In another aspect, a display device is provided. The display device includes the display panel in any one of the above embodiments.

In yet another aspect, a method for manufacturing a display panel is provided. The method for manufacturing the display panel includes: providing a substrate; forming a light-emitting structure layer on a side of the substrate, the light-emitting structure layer having a plurality of light-emitting regions and a non-light-emitting region for spacing the plurality of light-emitting regions apart from each other; forming a specular reflection layer on a side of the light-emitting structure layer away from the substrate, the specular reflection layer covering at least the non-light-emitting region; and forming an interference adjustment layer on a side of the specular reflection layer away from the light-emitting structure layer, the interference adjustment layer being configured such that lights of some colors interfere destructively to form a mirror display of a set color.

In some embodiments, forming the interference adjustment layer on the side of the specular reflection layer away from the light-emitting structure layer, includes: forming first refractive index layers and at least one second refractive index layer sequentially and alternately on the side of the specular reflection layer away from the light-emitting structure layer. A number of the first refractive index layers is one more than a number of the at least one second refractive index layer. A refractive index of the first refractive index layers is less than a refractive index of the at least one second refractive index layer.

In some embodiments, forming the interference adjustment layer on the side of the specular reflection layer away from the light-emitting structure layer, further includes: etching the first refractive index layers and the at least one second refractive index layer to form a plurality of first openings for exposing the plurality of light-emitting regions.

In some embodiments, forming the interference adjustment layer on the side of the specular reflection layer away from the light-emitting structure layer, includes: forming an interference adjustment layer of a single-layer structure on the side of the specular reflection layer away from the light-emitting structure layer. A material for forming the interference adjustment layer includes at least one of tantalum metal and molybdenum oxide. Alternatively, a material for forming the interference adjustment layer includes at least one of molybdenum dioxide, ferric oxide and indium oxide. Alternatively, a material for forming the interference adjustment layer includes at least one of niobium carbide and zinc oxide.

In some embodiments, a thickness of the interference adjustment layer is in any one of a range of a difference between 35 nm and 5 nm to a sum of 35 nm and 5 nm, a range of a difference between 45 nm and 5 nm to a sum of 45 nm and 5 nm or a range of a difference between 55 nm and 5 nm to a sum of 55 nm and 5 nm. Forming the interference adjustment layer on the side of the specular reflection layer away from the light-emitting structure layer, further includes: etching the interference adjustment layer of the single-layer structure to form a plurality of first openings for exposing the plurality of light-emitting regions.

In some embodiments, a thickness of the interference adjustment layer is in a range of a difference between 15 nm and 1 nm to a sum of 15 nm and 1 nm. Before forming the interference adjustment layer on the side of the specular reflection layer away from the light-emitting structure layer, the method for manufacturing the display panel further includes: forming a light transmission adjustment layer on the side of the specular reflection layer away from the light-emitting structure layer. A thickness of the light transmission adjustment layer is in any one of a range of a difference between 25 nm and 2 nm to a sum of 25 nm and 2 nm, a range of a difference between 33 nm and 2 nm to a sum of 33 nm and 2 nm, or a range of a difference between 50 nm and 2 nm to a sum of 50 nm and 2 nm.

In some embodiments, forming the specular reflection layer on the side of the light-emitting structure layer away from the substrate, includes: forming a metal reflection film on the side of the light-emitting structure layer away from the substrate, and etching the metal reflection film to form a specular reflection layer including a plurality of second openings. The plurality of second openings expose the plurality of light-emitting regions. Alternatively, forming the specular reflection layer on the side of the light-emitting structure layer away from the substrate, includes: forming a transflective film on the side of the light-emitting structure layer away from the substrate. The transflective film covers the plurality of light-emitting regions and the non-light-emitting region, and the transflective film is the specular reflection layer.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on an actual size of a product, an actual process of a method, and an actual timing of a signal involved in the embodiments of the present disclosure.

DETAILED DESCRIPTION

Figure 1:
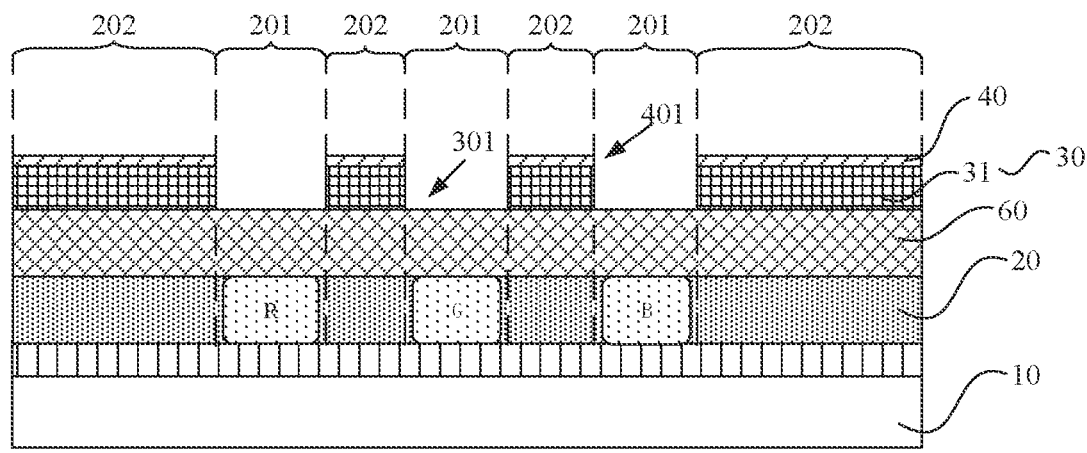
FIG. 1 is a structural diagram of a display panel, in accordance with some embodiments.

Technical solutions in some embodiments of the present disclosure will be described dearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The use of the phrase "applicable to" or "configured to" herein means an open and inclusive expression, which does not exclude devices that are applicable to or configured to perform additional tasks or steps.

In addition, the use of the phrase "based on" is meant to be open and inclusive, in that a process, step, calculation, or other action that is "based on" one or more of the stated conditions or values may, in practice, be based on additional conditions or values exceeding those stated.

The term such as "approximately" or "substantially" as used herein includes a stated value and an average value within an acceptable range of deviation of a particular value determined by a person of ordinary skill in the art, considering measurement in question and errors associated with measurement of a particular quantity (i.e., limitations of a measurement system).

Exemplary embodiments are described herein with reference to sectional views and/or plan views as idealized exemplary drawings. In the accompanying drawings, thicknesses of layers and regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

In the related art, a mirror display device directly reflects an incident light by using a metal reflection layer, so as to realize mirror function(s). However, the metal reflection layer has a high light reflectivity, and when a user uses the mirror function(s) of the mirror display device, a mirror surface has a single color, and the user is likely to feel glare, thereby generating a dazzling feeling.

Based on this, as shown in FIG. 1, some embodiments of the present disclosure provide a display panel 100. The display panel 100 includes a substrate 10, a light-emitting structure layer 20, a specular reflection layer 30 and an interference adjustment layer 40. The light-emitting structure layer 20 is located on a side of the substrate 10. The light-emitting structure layer 20 has a plurality of light-emitting regions 201 and a non-light-emitting region 202 for spacing the plurality of light-emitting regions 201 apart from each other. The specular reflection layer 30 is located on a side of the light-emitting structure layer 20 away from the substrate 10. The specular reflection layer 30 covers at least the non-light-emitting region 202. The interference adjustment layer 40 is located on a side of the specular reflection layer 30 away from the light-emitting structure layer 20. The interference adjustment layer 40 is configured such that lights of some colors interfere destructively to form a mirror display of a set color.

The substrate 10 may be made of polyimide (PI).

Figure 2:
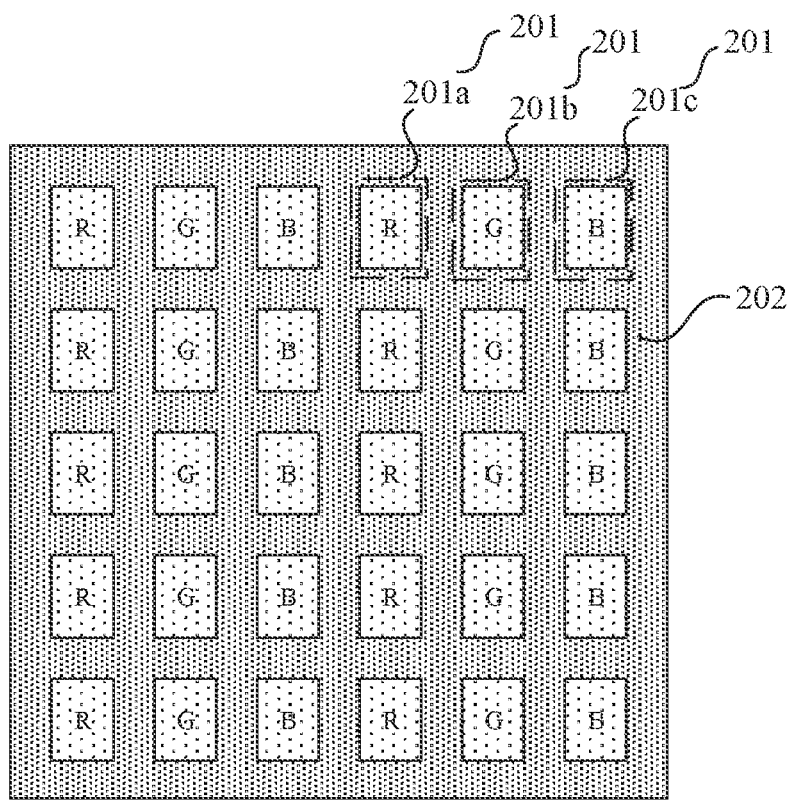
FIG. 2 is a structural diagram of a light-emitting structure layer, in accordance with some embodiments.

The light-emitting structure layer 20 has the plurality of light-emitting regions 201. For example, the light-emitting structure layer 20 may have a plurality of red light-emitting regions 201a, a plurality of green light-emitting regions 201b and a plurality of blue light-emitting regions 201c (as shown in FIG. 2). Alternatively, the light-emitting structure layer 20 may have a plurality of red light-emitting regions, a plurality of green light-emitting regions, a plurality of blue light-emitting regions and a plurality of white light-emitting regions. Light-emitting devices in the plurality of light-emitting regions 201 may be driven to emit light, so as to realize a display function of the display panel 100. The number of the light-emitting regions 201, an arrangement of the light-emitting regions 201 of different colors, and a size of the light-emitting region 201 are not limited, as long as the display panel 100 is able to display a screen.

For example, the display panel 100 may be an OLED display panel, and in this case, the light-emitting device in the light-emitting structure layer 20 may be an organic light-emitting diode. Based on this, the light-emitting structure layer 20 may include an anode layer, an organic light-emitting layer and a cathode layer. Alternatively, the light-emitting structure layer 20 may include an anode layer, a hole transport layer, an organic light-emitting layer, an electron transport layer and a cathode layer. Alternatively, the light-emitting structure layer 20 may include an anode layer, a hole injection layer, a hole transport layer, an organic light-emitting layer, an electron transport layer, an electron injection layer and a cathode layer.

The specular reflection layer 30 covers at least the non-light-emitting region 202, which may be that the specular reflection layer 30 covers only the non-light-emitting region 202, or the specular reflection layer 30 covers both the plurality of light-emitting regions 201 and the non-light-emitting region 202.

In some embodiments, as shown in FIG. 1, the specular reflection layer 30 covers only the non-light-emitting region 202. In this case, the specular reflection layer 30 may be a metal reflection layer 31, and the metal reflection layer 31 may include a plurality of second openings 301 for exposing the plurality of light-emitting regions 201. By such arrangement, not only the metal reflection layer 31 is able to effectively reflect light incident on the display panel 100, but also a case that the display panel 100 cannot display normally due to light emitted from the light-emitting region 201 being blocked by the specular reflection layer 30 is able to be avoided.

The specular reflection layer 30 may be a single-layer metal reflection layer. For example, a material of the specular reflection layer 30 may include at least one of aluminum, molybdenum, titanium, silver and copper.

Alternatively, the specular reflection layer 30 may be of a multi-layer structure including a metal reflection layer. For example, the specular reflection layer 30 may include a titanium metal layer, an aluminum metal layer and a titanium metal layer that are stacked in sequence. Alternatively, the specular reflection layer 30 may include an indium tin oxide layer, a silver metal layer and an indium tin oxide layer that are stacked in sequence.

Figure 3:
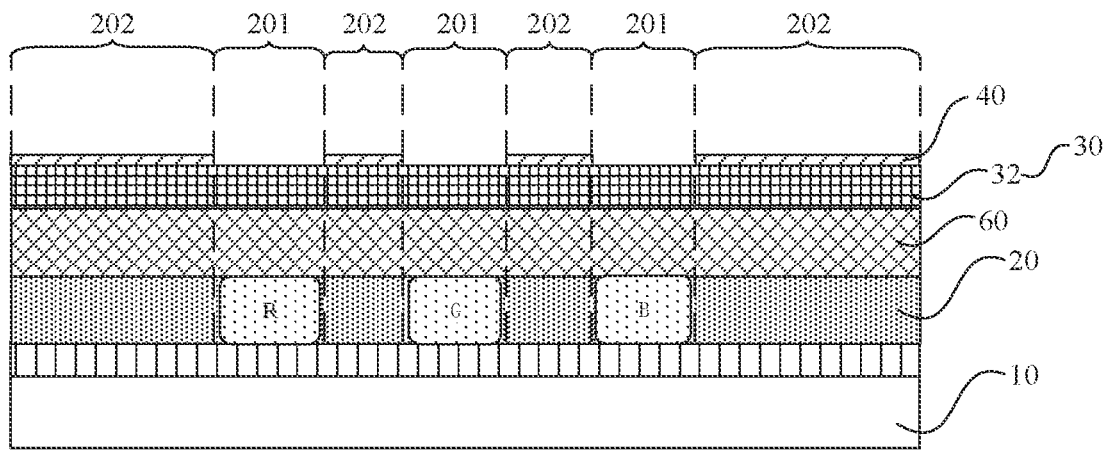
FIG. 3 is a structural diagram of another display panel, in accordance with some embodiments.

In some other embodiments, as shown in FIG. 3, the specular reflection layer 30 covers both the plurality of light-emitting regions 201 and the non-light-emitting region 202. In this case, the specular reflection layer 30 may be a transflective layer 32, and the lights emitted from the light-emitting regions 201 may pass through the specular reflection layer 30 to exit. Therefore, no opening is required to be provided in the specular reflection layer 30, so that a manufacturing process of the specular reflection layer 30 is simplified, thereby saving time and reducing a manufacturing cost.

For example, the transflective layer 32 may be a reflective polarizing optical sheet, or a multi-layer optical film composed of a reflective polarizing optical sheet and a polarizer.

In some embodiments, the thickness of the specular reflection layer 30 may be in a range of a difference between 330 nm and 5 nm to a sum of 330 nm and 5 nm (i.e., 330 nm±5 nm). Here, "330 nm±5 nm" means that the thickness of the specular reflection layer 30 may be 330 nm, and the specular reflection layer 30 is allowed to have a deviation of ±5 nm in thickness, which may be caused by a process of forming the specular reflection layer 30.

It will be noted that visible lights are a part that may be perceived by human eyes in an electromagnetic spectrum, and wavelengths of electromagnetic waves that may be perceived by an ordinary person's eyes are in a range of 400 nm to 760 nm. Still others are able to perceive electromagnetic waves with wavelengths between approximately 380 nm and 780 nm. Each color of visible light corresponds to a different wavelength range. For example, a purple light corresponds to a wavelength range of 400 nm to 450 nm, a blue light corresponds to a wavelength range of 450 nm to 480 nm, a green-blue light corresponds to a wavelength range of 480 nm to 490 nm, a blue-green light corresponds to a wavelength range of 490 nm to 500 nm, a green light corresponds to a wavelength range of 500 nm to 560 nm, a yellow-green light corresponds to a wavelength range of 560 nm to 580 nm, a yellow light corresponds to a wavelength range of 580 nm to 610 nm, an orange light corresponds to a wavelength range of 610 nm to 650 nm, a red light corresponds to a wavelength range of 650 nm to 760 nm.

Interference means that two or more waves are overlapped and superimposed in space to form a new waveform. Interference conditions are that two light waves have a same vibration frequency, and have a fixed phase difference at a meeting point. Destructive interference means that in the interference of light, wave crests and wave troughs of two light waves meet, and an amplitude is equal to zero.

Figure 4:
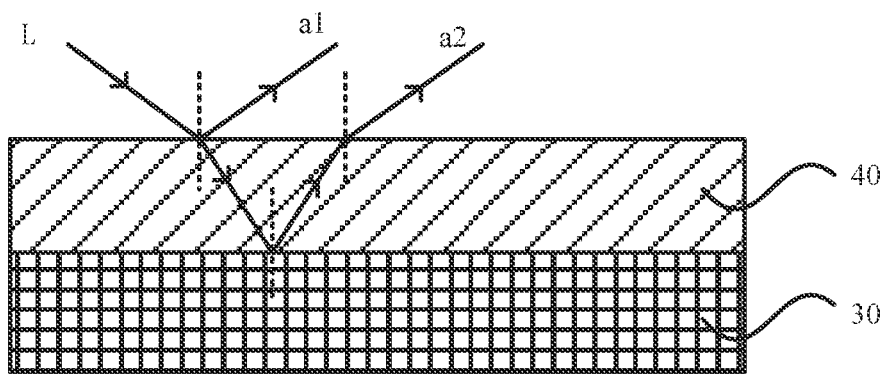
FIG. 4 is a route diagram of light propagation, in accordance with some embodiments.

Based on this, referring to FIG. 4, the interference adjustment layer 40 makes the lights of some colors interfere destructively, which may be, for example, as follows. A part of a light L of a certain color is reflected on an upper surface of the interference adjustment layer 40, so as to obtain a light a1. Another part of the light L is transmitted into the interference adjustment layer 40, is reflected on a lower surface of the interference adjustment layer 40, and is finally emitted from the upper surface of the interference adjustment layer 40, so as to obtain a light a2. The interference adjustment layer 40 makes a path difference between the light a1 and the light a2 be an odd multiple of a half-wavelength of the light of this color, so that wave crests and wave troughs of the light a1 and the light a2 meet in the interference, and an amplitude becomes zero.

In some embodiments of the present disclosure, the interference adjustment layer 40 is provided on the side of the specular reflection layer 30 away from the light-emitting structure layer 20, and the interference adjustment layer 40 is used to make the lights of some colors interfere destructively. On one hand, an intensity of a light reflected by the display panel 100 is able to be effectively reduced, so that a color of a mirror display screen of the display panel 100 is dark, and a user is less likely to feel glare and dazzling when using mirror function(s) of the display panel 100. On another hand, by this arrangement, the display panel 100 is able to form the mirror display of the set color, so that the display panel is more beautiful, and a fashionability of the display panel 100 is improved.

Figure 5:
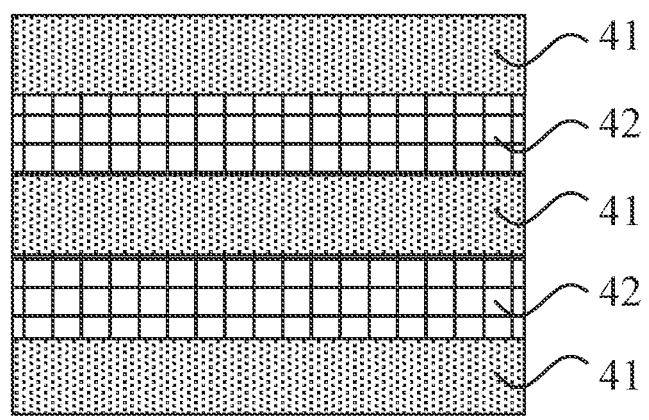
FIG. 5 is a structural diagram of an interference adjustment layer, in accordance with some embodiments.

In some embodiments, as shown in FIG. 5, the interference adjustment layer 40 includes at least two first refractive index layers 41 that are stacked, and a second refractive index layer 42 located between every two adjacent first refractive index layers 41. A refractive index of the second refractive index layer 42 is greater than that of the first refractive index layer 41.

For example, the interference adjustment layer 40 may include a first refractive index layer 41, a second refractive index layer 42, a first refractive index layer 41, a second refractive index layer 42 and a first refractive index layer 41 that are stacked in sequence (as shown in FIG. 5). Alternatively, the interference adjustment layer 40 may include a first refractive index layer 41, a second refractive index layer 42 and a first refractive index layer 41 that are stacked in sequence. Alternatively, the interference adjustment layer 40 may include a first refractive index layer 41, a second refractive index layer 42, a first refractive index layer 41, a second refractive index layer 42, a first refractive index layer 41, a second refractive index layer 42 and a first refractive index layer 41 that are stacked in sequence. The number of first refractive index layers 41 and the number of second refractive index layer(s) 42 are not limited thereto, as long as the lights of some colors interfere destructively.

By providing an outermost layer of the interference adjustment layer 40 as the first refractive index layer 41 with a low refractive index, more light irradiated from a side of the interference adjustment layer 40 away from the specular reflection layer 30 to the interference adjustment layer 40 is able to be incident into the interference adjustment layer 40. Moreover, since the interference adjustment layer 40 includes a structure in which the first refractive index layers 41 with a low refractive index and the second refractive index layer(s) 42 with a high refractive index are overlapped with each other, it is possible to make the lights of some colors interfere destructively by using the multiple-beam interference principle, so that a color of a mirror surface formed by the interference adjustment layer 40 is dark.

In some embodiments, a material of the first refractive index layer 41 may include silicon dioxide ($SiO_2$) or magnesium fluoride (MgF).

In some embodiments, the refractive index of the first refractive index layer 41 is in a range of 1.3 to 1.5, inclusive.

In some embodiments, a material of the second refractive index layer 42 may include metal. For example, the second refractive index layer 42 may made of any one of aluminum, molybdenum, titanium, silver and copper. The thickness of the second refractive index layer 42 may be in a range of a difference between 4 nm and 1 nm to a sum of 4 nm and 1 nm (i.e., 4 nm±1 nm). That is, the thickness of the second refractive index layer 42 may be 4 nm, and the second refractive index layer 42 may have a deviation of ±1 nm in thickness, which may be caused by a process of forming the second refractive index layer 42.

In some embodiments, the thickness of the first refractive index layer 41 may be in any one of a range of a difference between 135 nm and 5 nm to a sum of 135 nm and 5 nm (i.e., 135 nm±5 nm), a range of a difference between 155 nm and 5 nm to a sum of 155 nm and 5 nm (i.e., 155 nm±5 nm), a range of a difference between 170 nm and 5 nm to a sum of 170 nm and 5 nm (i.e., 170 nm±5 nm), a range of a difference between 195 nm and 5 nm to a sum of 195 nm and 5 nm (i.e., 195 nm±5 nm), a range of a difference between 210 nm and 5 nm to a sum of 210 nm and 5 nm (i.e., 210 nm±5 nm), a range of a difference between 225 nm and 5 nm to a sum of 225 nm and 5 nm (i.e., 225 nm±5 nm) or a range of a difference between 240 nm and 5 nm to a sum of 240 nm and 5 nm (i.e., 240 nm±5 nm). It will be noted that "±5 nm" means that the first refractive index layer 41 may have a deviation of ±5 nm in thickness, and this deviation may be caused by a process of forming the first refractive index layer 41.

Figure 6A:
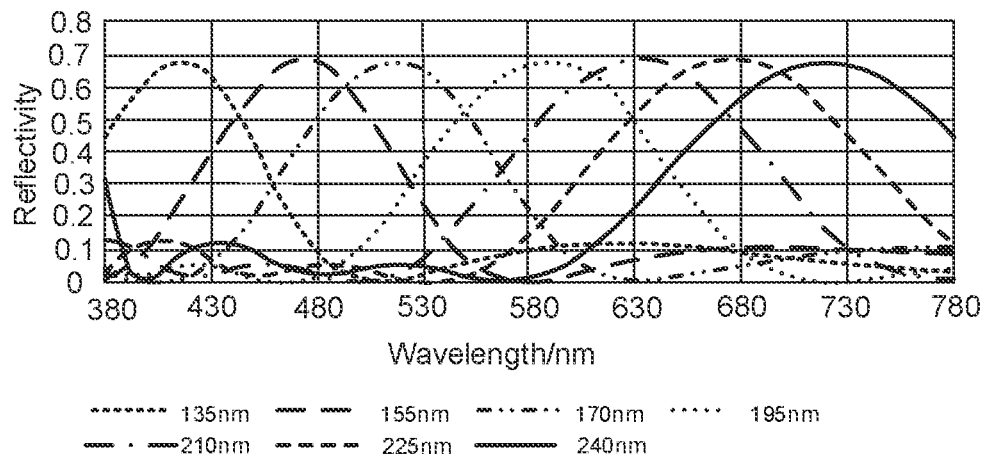
FIG. 6A is a graph showing test results of a reflectivity of an interference adjustment layer for lights of different colors, in accordance with some embodiments.

For example, in a case where the specular reflection layer 30 is made of molybdenum metal, the first refractive index layer 41 is made of silicon dioxide, the second refractive index layer 42 is made of titanium metal, the thickness of the specular reflection layer 30 is 330 nm, the thickness of the second refractive index layer 42 is 4 nm, and the thickness of the first refractive index layer 41 is 135 nm, 155 nm, 170 nm, 195 nm, 210 nm, 225 nm or 240 nm, test results of a reflectivity (i.e., a ratio of a light intensity of a reflected light to a light intensity of an incident light) of the interference adjustment layer 40 after lights with wavelengths are reflected by the interference adjustment layer 40 are shown in FIG. 6A.

In combination with FIG. 6A, it can be seen that in the case where the thickness of the first refractive index layer 41 is 135 nm, for light with a wavelength range of approximately 410 nm to 430 nm, the reflectivity is highest. That is, the interference adjustment layer 40 reflects a purple light most, and the interference adjustment layer 40 may form a purple mirror display. In the case where the thickness of the first refractive index layer 41 is 155 nm, for light with a wavelength range of approximately 460 nm to 480 nm, the reflectivity is highest. That is, the interference adjustment layer 40 reflects a blue light most, and thus the interference adjustment layer 40 may form a blue mirror display. In the case where the thickness of the first refractive index layer 41 is 170 nm, for light with a wavelength range of approximately 510 nm to 530 nm, the reflectivity is highest. That is, the interference adjustment layer 40 reflects a green light most, and the interference adjustment layer 40 may form a green mirror display. In the case where the thickness of the first refractive index layer 41 is 195 nm, for light with a wavelength range of approximately 580 nm to 600 nm, the reflectivity is highest. That is, the interference adjustment layer 40 reflects a yellow light most, and the interference adjustment layer 40 may form a yellow mirror display. In the case where the thickness of the first refractive index layer 41 is 210 nm, for light with a wavelength range of approximately 620 nm to 640 nm, the reflectivity is highest. That is, the interference adjustment layer 40 reflects an orange light most, and the interference adjustment layer 40 may form an orange mirror display. In the case where the thickness of the first refractive index layer 41 is 225 nm, for light with a wavelength range of approximately 670 nm to 690 nm, the reflectivity is highest. That is, the interference adjustment layer 40 reflects a red light most, and the interference adjustment layer 40 may form a red mirror display. In the case where the thickness of the first refractive index layer 41 is 240 nm, for light with a wavelength range of approximately 710 nm to 730 nm, the reflectivity is highest. That is, the interference adjustment layer 40 reflects a purple-red light most, and the interference adjustment layer 40 may form a purple-red mirror display.

In addition, based on the reflectivity curves shown in FIG. 6A, in combination with the light source spectrum and the color matching function of human eyes, tristimulus values X, Y and Z are able to be calculated. According to the tristimulus values X, Y and Z, chromaticity coordinate values may be calculated, so that a color of a light reflected by the interference adjustment layer 40 is obtained by using the chromaticity coordinate values and the CIE chromaticity diagram.

For example, the tristimulus values X, Y and Z may be calculated by using following Formula (1), Formula (2) and Formula (3), and then the chromaticity coordinate values may be calculated by using Formula (4) and Formula (5).

$$X = \sum_{380}^{780} R(\lambda)S(\lambda)\bar{x}(\lambda)d\lambda \qquad (1)$$

-continued $$Y = \sum_{380}^{780} R(\lambda)S(\lambda)\overline{y}(\lambda)d\lambda \qquad (2)$$

$$Z = \sum_{380}^{780} R(\lambda)S(\lambda)\overline{z}(\lambda)d\lambda \qquad (3)$$

$$x = X/(X + Y + Z) \qquad (4)$$

$$y = Y/(X + Y + Z) \qquad (5)$$

Here, $R(\lambda)$ represents a reflectivity for a light with a wavelength of $\lambda$, $S(\lambda)$ represents an energy of a light with a wavelength of $\lambda$ in a natural light source, $\overline{x}(\lambda)$, $\overline{y}(\lambda)$ and $\overline{z}(\lambda)$ represent color matching function values for a light with a wavelength of $\lambda$, and $\lambda$ is a wavelength of a light wave.

Following chromaticity coordinate values may be calculated by using the above formulas. In the case where the thickness of the first refractive index layer 41 is 135 nm, chromaticity coordinate values of the light reflected by the interference adjustment layer 40 are x that is equal to 0.24, and y that is equal to 0.11 (i.e., x=0.24 and y=0.11). In the case where the thickness of the first refractive index layer 41 is 155 nm, chromaticity coordinate values of the light reflected by the interference adjustment layer 40 are x that is equal to 0.15, and y that is equal to 0.18 (i.e., x=0.15 and y=0.18). In the case where the thickness of the first refractive index layer 41 is 170 nm, chromaticity coordinate values of the light reflected by the interference adjustment layer 40 are x that is equal to 0.21, and y that is equal to 0.46 (i.e., x=0.21 and y=0.46). In the case where the thickness of the first refractive index layer 41 is 195 nm, chromaticity coordinate values of the light reflected by the interference adjustment layer 40 are x that is equal to 0.47, and y that is equal to 0.49 (i.e., x=0.47 and y=0.49). In the case where the thickness of the first refractive index layer 41 is 210 nm, chromaticity coordinate values of the light reflected by the interference adjustment layer 40 are x that is equal to 0.55, and y that is equal to 0.40 (i.e., x=0.55 and y=0.40). In the case where the thickness of the first refractive index layer 41 is 225 nm, chromaticity coordinate values of the light reflected by the interference adjustment layer 40 are x that is equal to 0.57, and y that is equal to 0.32 (i.e., x=0.57 and y=0.32). In the case where the thickness of the first refractive index layer 41 is 240 nm, chromaticity coordinate values of the light reflected by the interference adjustment layer 40 are x that is equal to 0.42, and y that is equal to 0.23 (i.e., x=0.42 and y=0.23).

Figure 6B:
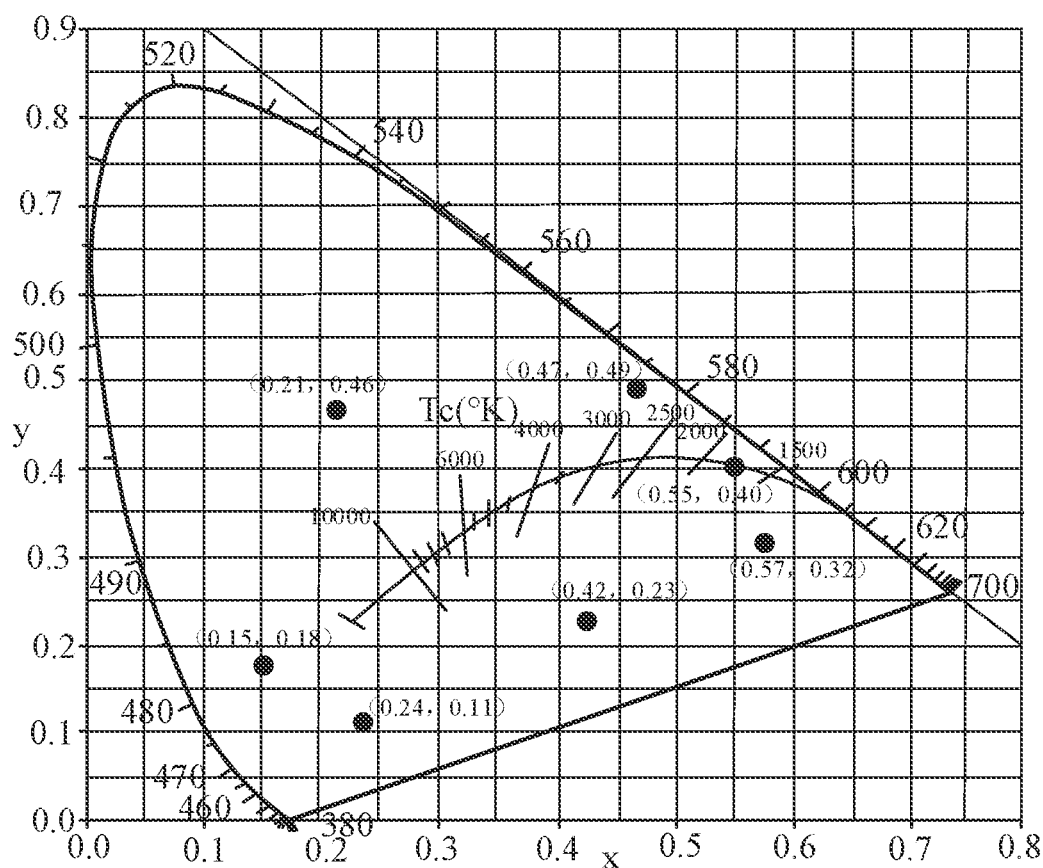
FIG. 6B is a graph showing chromaticity coordinate results, in accordance with some embodiments.

On this basis, in combination with FIG. 6B, it can be seen that in the case where the thickness of the first refractive index layer 41 is 135 nm, a chromaticity coordinate point is located in a purple region, and is dose to an edge of the chromaticity diagram. That is, the interference adjustment layer 40 is able to reflect a dark purple light to form a dark purple mirror display. In the case where the thickness of the first refractive index layer 41 is 155 nm, a chromaticity coordinate point is located in a blue region, and is close to the edge of the chromaticity diagram, and the interference adjustment layer 40 reflects a dark blue light to form a dark blue mirror display. In the case where the thickness of the first refractive index layer 41 is 170 nm, a chromaticity coordinate point is located in a green region, and is close to the edge of the chromaticity diagram, and the interference adjustment layer 40 reflects a dark green light to form a dark green mirror display. In the case where the thickness of the first refractive index layer 41 is 195 nm, a chromaticity coordinate point is located in a yellow region, and is close to the edge of the chromaticity diagram, and the interference adjustment layer 40 reflects a dark yellow light to form a dark yellow mirror display. In the case where the thickness of the first refractive index layer 41 is 210 nm, a chromaticity coordinate point is located in an orange region, and is close to the edge of the chromaticity diagram, and the interference adjustment layer 40 reflects a dark orange light to form a dark orange mirror display. In the case where the thickness of the first refractive index layer 41 is 225 nm, a chromaticity coordinate point is located in a red region, and is close to the edge of the chromaticity diagram, and the interference adjustment layer 40 reflects a dark red light to form a dark red mirror display. In the case where the thickness of the first refractive index layer 41 is 240 nm, a chromaticity coordinate point is located in a purple-red region, and is close to the edge of the chromaticity diagram, and the interference adjustment layer 40 reflects a dark purple-red light to form a dark purple-red mirror display.

In this way, in a case where the structure of the interference adjustment layer 40 is used in some embodiments of the present disclosure, the color of the mirror surface formed by reflection of the display panel 100 may be adjusted by changing the thickness of the first refractive index layer 41, and the color of the mirror surface may be any one of dark purple, dark blue, dark green, dark yellow, dark orange, dark red or dark purple-red.

In some embodiments, referring to FIGS. 1 and 5, in a case where the interference adjustment layer 40 includes the at least two first refractive index layers 41 and the second refractive index layers 42 located between every two adjacent first refractive index layers 41, the interference adjustment layer 40 may further include a plurality of first openings 401 for exposing the plurality of light-emitting regions 201.

The plurality of first openings 401 are provided in the interference adjustment layer 40 to expose the plurality of light-emitting regions 201, so that light emitted from the light-emitting device in the light-emitting region 201 is able to not pass through the interference adjustment layer 40, so as to reduce an energy loss of the light emitted from the light-emitting device, thereby ensuring that the display panel 100 is able to normally display a screen when a color mirror display is realized.

In some other embodiments, the interference adjustment layer 40 may be of a single-layer structure. In this case, a material of the interference adjustment layer 40 may include at least one of tantalum (Ta) metal and molybdenum oxide ($MoO_x$). Alternatively, the material of the interference adjustment layer 40 includes at least one of molybdenum dioxide ($MoO_2$), ferric oxide ($Fe_2O_3$) and indium oxide ($In_2O_3$). Alternatively, the material of the interference adjustment layer 40 includes at least one of niobium carbide (NbC) and zinc oxide (ZnO).

For example, in a case where the interference adjustment layer 40 is made of a mixture of tantalum metal and molybdenum oxide, by adjusting proportions of tantalum metal and molybdenum oxide, for a light with a wavelength of 550 nm, a refractive index of the interference adjustment layer 40 may be approximately 2.37, and an extinction coefficient of the interference adjustment layer 40 may be approximately 0.77. In a case where the interference adjustment layer 40 is made of a mixture of molybdenum dioxide, ferric oxide and indium oxide, by adjusting proportions of molybdenum dioxide, ferric oxide and indium oxide, for the light with the wavelength of 550 nm, the refractive index of the interference adjustment layer 40 may be approximately 2.59, and the extinction coefficient of the interference adjustment layer 40 may be approximately 0.64. In a case where the interference adjustment layer 40 is made of a mixture of niobium carbide and zinc oxide, by adjusting proportions of niobium carbide and zinc oxide, for the light with the wavelength of 550 nm, the refractive index of the interference adjustment layer 40 may be approximately 2.42, and the extinction coefficient of the interference adjustment layer 40 may be approximately 0.57.

The material of the interference adjustment layer 40 in some embodiments of the present disclosure is not limited thereto. For example, the interference adjustment layer 40 may also be made of other material satisfying a condition that, for the light with the wavelength of 550 nm, the refractive index of the interference adjustment layer is in a range of 2.3 to 2.6, inclusive, and the extinction coefficient of the interference adjustment layer is in a range of 0.57 to 0.77, inclusive.

By using the single-layer interference adjustment layer in some embodiments, an absorption effect of the interference adjustment layer 40 on a light incident on the display panel 100 is able to be improved, thereby realizing a dark color mirror display of the display panel 100.

In a case where the interference adjustment layer 40 is of the single-layer structure, in some embodiments, the specular reflection layer 30 may be made of aluminum metal. Thus, the mirror surface formed by the interference adjustment layer 40 has a wider color gamut. That is, chromaticity coordinate points are more dispersed in the chromaticity diagram, and are closer to the edge of the chromaticity diagram, and the color of the mirror display may be darker.

In some embodiments, the thickness of the interference adjustment layer 40 may be in any one of a range of a difference between 35 nm and 5 nm to a sum of 35 nm and 5 nm (i.e., 35 nm±5 nm), a range of a difference between 45 nm and 5 nm to a sum of 45 nm and 5 nm (i.e., 45 nm±5 nm) or a range of a difference between 55 nm and 5 nm to a sum of 55 nm and 5 nm (i.e., 55 nm±5 nm). Here, "±5 nm" means that the interference adjustment layer 40 may have a deviation of ±5 nm in thickness, and this deviation may be, for example, caused by a process of forming the interference adjustment layer 40.

Figure 7A:
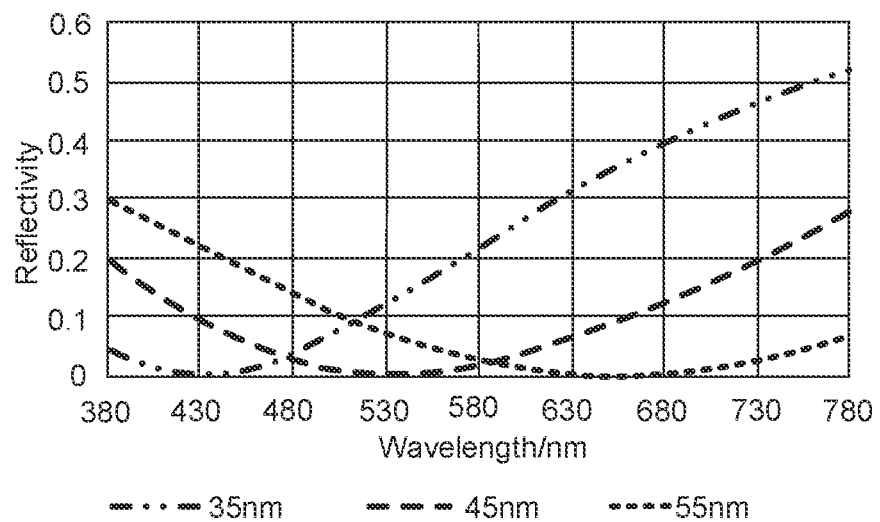
FIG. 7A is a graph showing test results of a reflectivity of another interference adjustment layer for lights of different colors, in accordance with some embodiments.

For example, in a case where the specular reflection layer 30 is made of aluminum metal, the material of the interference adjustment layer 40 includes niobium carbide and zinc oxide, the thickness of the specular reflection layer 30 is 330 nm, and the thickness of the interference adjustment layer 40 is 35 nm, 45 nm or 55 nm, test results of the reflectivity of the interference adjustment layer 40 after lights with wavelengths are reflected by the interference adjustment layer 40 are shown in FIG. 7A.

On this basis, according to the reflectivity curves shown in FIG. 7A, in combination with the light source spectrum and the color matching function of human eyes, tristimulus values X, Y and Z of a light reflected by the interference adjustment layer 40 may be calculated by using the above Formula (1), Formula (2) and Formula (3) in the case where the thickness of the interference adjustment layer 40 is 35 nm, 45 nm or 55 nm. Based on the tristimulus values X, Y and Z of the light reflected by the interference adjustment layer 40, chromaticity coordinate values of the light reflected by the interference adjustment layer 40 may be calculated according to the above Formula (4) and Formula (5). In the case where the thickness of the interference adjustment layer 40 is 35 nm, 45 nm or 55 nm, the color of the light reflected by the interference adjustment layer 40 may be determined by using the chromaticity coordinate values and the CIE chromaticity diagram.

In the case where the thickness of the interference adjustment layer 40 is 35 nm, chromaticity coordinate values of the light reflected by the interference adjustment layer 40 are calculated to be x that is equal to 0.5, and y that is equal to 0.45 (i.e., x=0.5 and y=0.45). In the case where the thickness of the interference adjustment layer 40 is 45 nm, chromaticity coordinate values of the light reflected by the interference adjustment layer 40 are calculated to be x that is equal to 0.32, and y that is equal to 0.15 (i.e., x=0.32 and y=0.15). In the case where the thickness of the interference adjustment layer 40 is 55 nm, chromaticity coordinate values of the light reflected by the interference adjustment layer 40 are calculated to be x that is equal to 0.17, and y that is equal to 0.18 (i.e., x=0.17 and y=0.18).

Figure 7B:
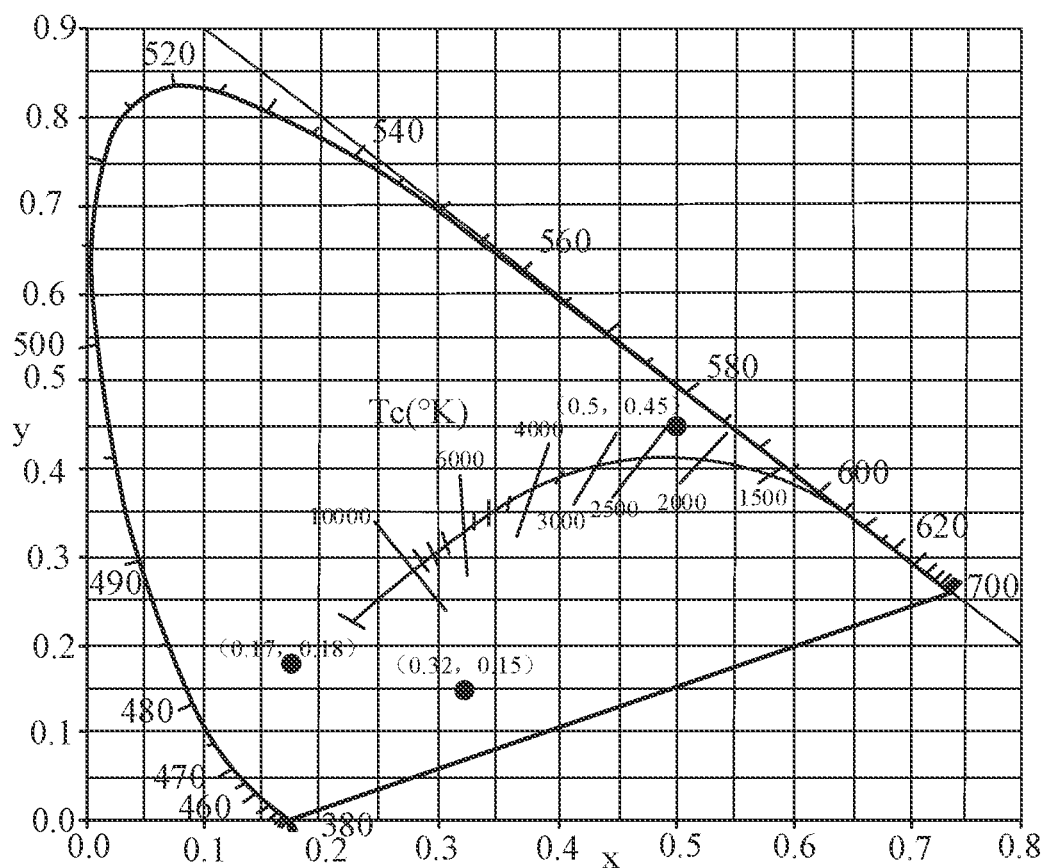
FIG. 7B is another graph showing chromaticity coordinate results, in accordance with some embodiments.
Figure 8:
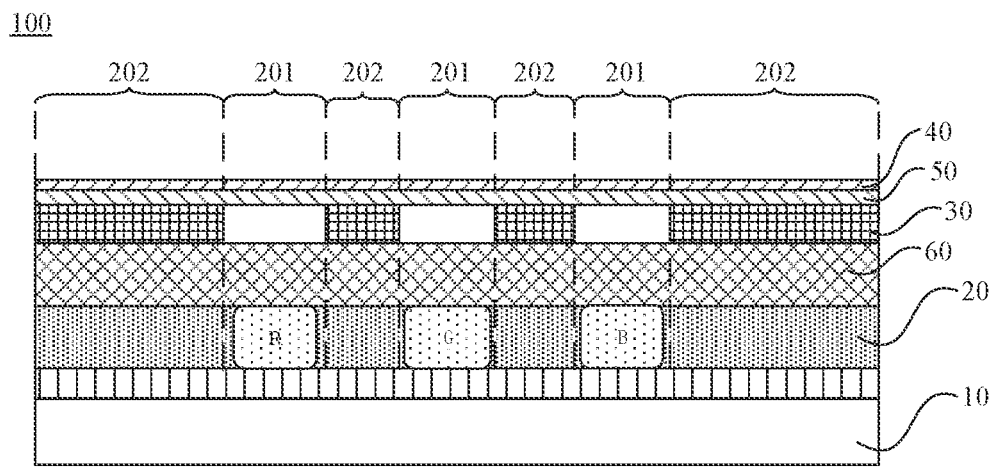
FIG. 8 is a structural diagram of yet another display panel, in accordance with some embodiments.

In combination with FIG. 7B, it can be seen that in the case where the thickness of the interference adjustment layer 40 is 35 nm, a chromaticity coordinate point is located in the yellow region, and is close to the edge of the chromaticity diagram, and thus the interference adjustment layer 40 reflects a dark yellow light to form a dark yellow mirror display. In the case where the thickness of the interference adjustment layer 40 is 45 nm, a chromaticity coordinate point is located in the purple region, and is close to the edge of the chromaticity diagram, and thus the interference adjustment layer 40 reflects a dark purple light to form a dark purple mirror display. In the case where the thickness of the interference adjustment layer 40 is 55 nm, a chromaticity coordinate point is located in the blue region, and is close to the edge of the chromaticity diagram, and thus the interference adjustment layer 40 reflects a dark blue light to form a dark blue mirror display.

In this way, the single-layer interference adjustment layer 40 is formed on the side of the specular reflection layer 30 away from the light-emitting structure layer 20. On one hand, the intensity of the light reflected by the display panel 100 may be low, the color of the mirror display may be dark, so that the user is less likely to feel glare and dazzling when using the display panel 100. On another hand, by changing the thickness of the interference adjustment layer 40, the display panel 100 is able to display a dark yellow mirror surface, a dark purple mirror surface or a dark blue mirror surface, so that the fashionability of the display panel 100 is improved.

In some embodiments, as shown in FIG. 1, in the case where the interference adjustment layer 40 is of the single-layer structure, the interference adjustment layer 40 may include a plurality of first openings 401 for exposing the plurality of light-emitting regions 201. In this way, when the display panel 100 drives the light-emitting device in the light-emitting region 201 to emit light, the light emitted from the light-emitting device may not pass through the interference adjustment layer 40, so as to reduce a loss of the light emitted from the light-emitting region 201, thereby ensuring that the display panel 100 is able to normally display a screen when the color mirror display of the display panel 100 is realized.

In some other embodiments, the thickness of the interference adjustment layer 40 is in a range of a difference between 15 nm and 1 nm to a sum of 15 nm and 1 nm (i.e., 15 nm±1 nm). Here, "15 nm±1 nm" means that the thickness of the interference adjustment layer 40 may be 15 nm, and the interference adjustment layer 40 is allowed to have a deviation of ±1 nm in thickness, and this deviation may be caused by the process of forming the interference adjustment layer 40.

On this basis, the display panel 100 may further include a light transmission adjustment layer 50. The light transmission adjustment layer 50 may be provided between the specular reflection layer 30 and the interference adjustment layer 40. The thickness of the light transmission adjustment layer 50 may be in any one of a range of a difference between 25 nm and 2 nm to a sum of 25 nm and 2 nm (i.e., 25 nm±2 nm), a range of a difference between 33 nm and 2 nm to a sum of 33 nm and 2 nm (i.e., 33 nm±2 nm), or a range of a difference between 50 nm and 2 nm to a sum of 50 nm and 2 nm (i.e., 50 nm±2 nm). Here, "±2 nm" means that the light transmission adjustment layer 50 may have a deviation of ±2 nm in thickness, and this deviation may be, for example, caused by a process of forming the light transmission adjustment layer 50.

By providing the light transmission adjustment layer 50, the thickness of the interference adjustment layer 40 is able to be reduced, and a transmittance of the interference adjustment layer 40 is able to be increased. When the display function of the display panel 100 is realized, even if the light emitted from the light-emitting region 201 passes through the interference adjustment layer 40, the energy loss is small, and the interference adjustment layer 40 has little influence on a display effect of the display panel 100. Based on this, no openings are required to be provided at respective positions of the interference adjustment layer 40 corresponding to the plurality of light-emitting regions 201, so that when the interference adjustment layer 40 is manufactured, the openings are not required to be formed by etching, which simplifies a process, and reduces costs.

Figure 9A:
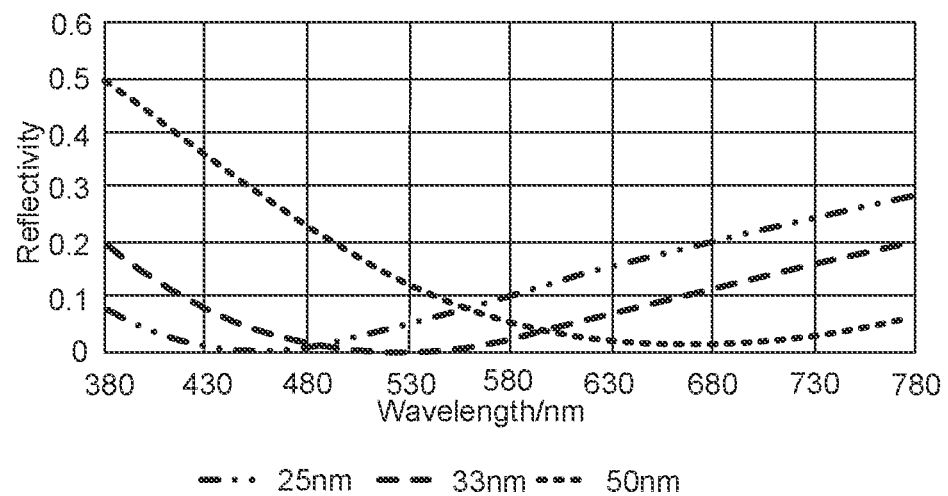
FIG. 9A is a graph showing test results of a reflectivity of a display panel for lights of different colors, in accordance with some embodiments.

For example, in a case where the specular reflection layer 30 is made of molybdenum metal, the material of the interference adjustment layer 40 includes niobium carbide and zinc oxide, the light transmission adjustment layer 50 is made of indium tin oxide, the thickness of the specular reflection layer 30 is 330 nm, the thickness of the interference adjustment layer 40 is 15 nm, and the thickness of the light transmission adjustment layer 50 is 25 nm, 33 nm or 50 nm, test results of a reflectivity of the display panel 100 after lights with different wavelengths are reflected by the display panel 100 are shown in FIG. 9A.

On this basis, according to the reflectivity curves shown in FIG. 9A, in combination with the light source spectrum and the color matching function of human eyes, tristimulus values X, Y and Z of the light reflected by the interference adjustment layer 40 may be obtained by using the above Formula (1), Formula (2) and Formula (3) in the case where the thickness of the light transmission adjustment layer 50 is 25 nm, 33 nm or 50 nm. Based on the tristimulus values X, Y and Z, chromaticity coordinate values of the light reflected by the interference adjustment layer 40 may be calculated by using the above Formula (4) and Formula (5). The color of the light reflected by the interference adjustment layer 40 may be determined according to the chromaticity coordinate values and the CIE chromaticity diagram.

In the case where the thickness of the light transmission adjustment layer 50 is 25 nm, chromaticity coordinate values of the light reflected by the interference adjustment layer 40 are calculated to be x that is equal to 0.52, and y that is equal to 0.45 (i.e., x=0.52 and y=0.45). In the case where the thickness of the light transmission adjustment layer 50 is 33 nm, chromaticity coordinate values of the light reflected by the interference adjustment layer 40 are calculated to be x that is equal to 0.36, and y that is equal to 0.18 (i.e., x=0.36 and y=0.18). In the case where the thickness of the light transmission adjustment layer 50 is 50 nm, chromaticity coordinate values of the light reflected by the interference adjustment layer 40 are calculated to be x that is equal to 0.17, and y that is equal to 0.10 (i.e., x=0.17 and y=0.10).

Figure 9B:
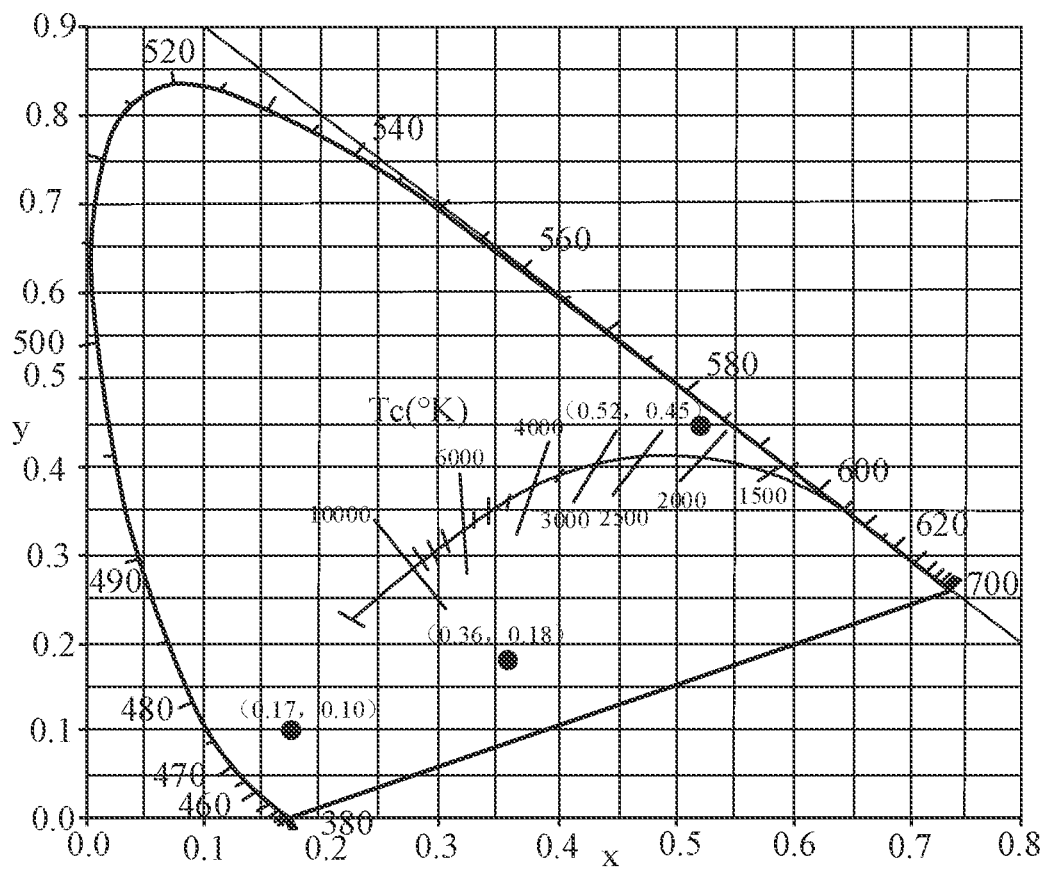
FIG. 9B is yet another graph showing chromaticity coordinate results, in accordance with some embodiments.

In combination with FIG. 9B, it can be seen that in the case where the thickness of the light transmission adjustment layer 50 is 25 nm, a chromaticity coordinate point is located in the yellow region, and is close to the edge of the chromaticity diagram, and thus the interference adjustment layer 40 reflects a dark yellow light to form a dark yellow mirror display. In the case where the thickness of the light transmission adjustment layer 50 is 33 nm, a chromaticity coordinate point is located in the purple region, and is close to the edge of the chromaticity diagram, and thus the interference adjustment layer 40 reflects a dark purple light to form a dark purple mirror display. In the case where the thickness of the light transmission adjustment layer 50 is 50 nm, a chromaticity coordinate point is located in the blue region, and is close to the edge of the chromaticity diagram, and thus the interference adjustment layer 40 reflects a dark blue light to form a dark blue mirror display.

In this way, the color of the mirror display of the display panel 100 may be adjusted by changing the thickness of the light transmission adjustment layer 50, so that the mirror display is able to display dark yellow, dark purple or dark blue, thereby improving the fashionability of the display panel 100.

For example, the light transmission adjustment layer 50 may be made of indium tin oxide (ITO). Alternatively, the light transmission adjustment layer 50 may be made of silicon nitride ($SiN_x$). Alternatively, for example, the light transmission adjustment layer 50 may be made of silicon dioxide ($SiO_2$).

In some embodiments, as shown in FIGS. 1, 3, 8 and 10, the display panel 100 further includes an encapsulation layer 60. The encapsulation layer 60 is located between the light-emitting structure layer 20 and the specular reflection layer 30. The encapsulation layer 60 is configured to encapsulate the light-emitting structure layer 20 on the substrate 10. In a case where the display panel 100 is an organic light-emitting diode (OLED) display panel, the light-emitting structure layer may be a light-emitting functional layer (e.g., including an anode, an organic light-emitting structure layer and a cathode). In this case, the encapsulation layer 60 is provided between the light-emitting structure layer 20 and the specular reflection layer 30, which is further able to be beneficial to protecting the light-emitting structure layer 20, so as to prevent the light-emitting structure layer 20 from being corroded by water vapor.

For example, the encapsulation layer 60 may be of a multi-layer structure, which includes an inorganic material layer, an organic material layer and an inorganic material layer that are stacked in sequence. The organic material layer is provided between the two inorganic material layers.

Figure 10:
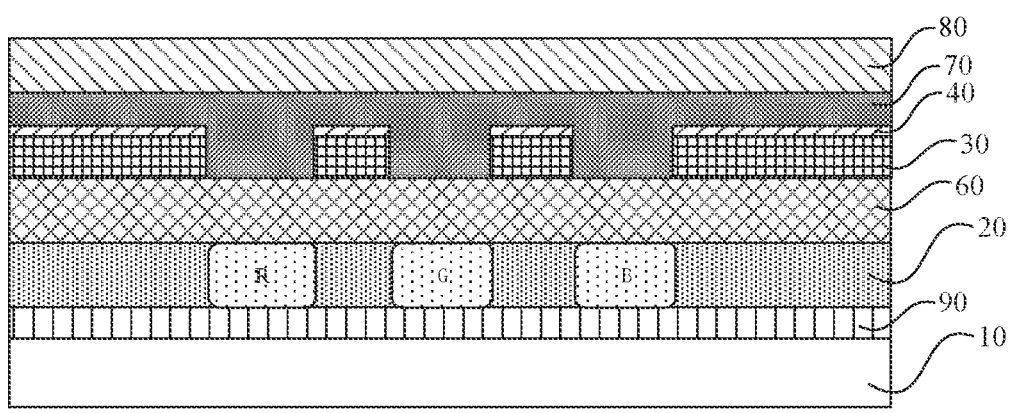
FIG. 10 is a structural diagram of yet another display panel, in accordance with some embodiments.

In some embodiments, as shown in FIG. 10, the display panel 100 further includes an optical adhesive layer 70 and a protective cover plate 80. The protective cover plate 80 is located on the side of the interference adjustment layer 40 away from the specular reflection layer 30. The protective cover plate 80 is configured to protect the interference adjustment layer 40, the specular reflection layer 30 and the light-emitting structure layer 20. The optical adhesive layer 70 is located between the interference adjustment layer 40 and the protective cover plate 80. The optical adhesive layer 70 is configured to adhere the protective cover plate 80 to a surface of the interference adjustment layer 40 away from the specular reflection layer 30.

The protective cover plate 80 may be a glass cover plate.

It will be noted that as shown in FIG. 10, the display panel 100 further includes a circuit structure layer 90 disposed between the light-emitting structure layer 20 and the substrate 10. The circuit structure layer 90 is used for driving the light-emitting devices in the light-emitting regions 201 in the light-emitting structure layer 20 to emit light.

In some embodiments, the circuit structure layer 90 may include a plurality of thin film transistors and storage capacitors for forming pixel driving circuits. The thin film transistor may be, for example, a low temperature polysilicon (LTPS) thin film transistor, or an indium gallium zinc oxide (IGZO) thin film transistor. For example, the circuit structure layer 90 may include an active layer, a first insulating layer, a first gate metal layer, a second insulating layer, a second gate metal layer, an interlayer dielectric layer, a source-drain electrode layer and a planarization layer that are away from the substrate 10 in sequence.

Figure 11:
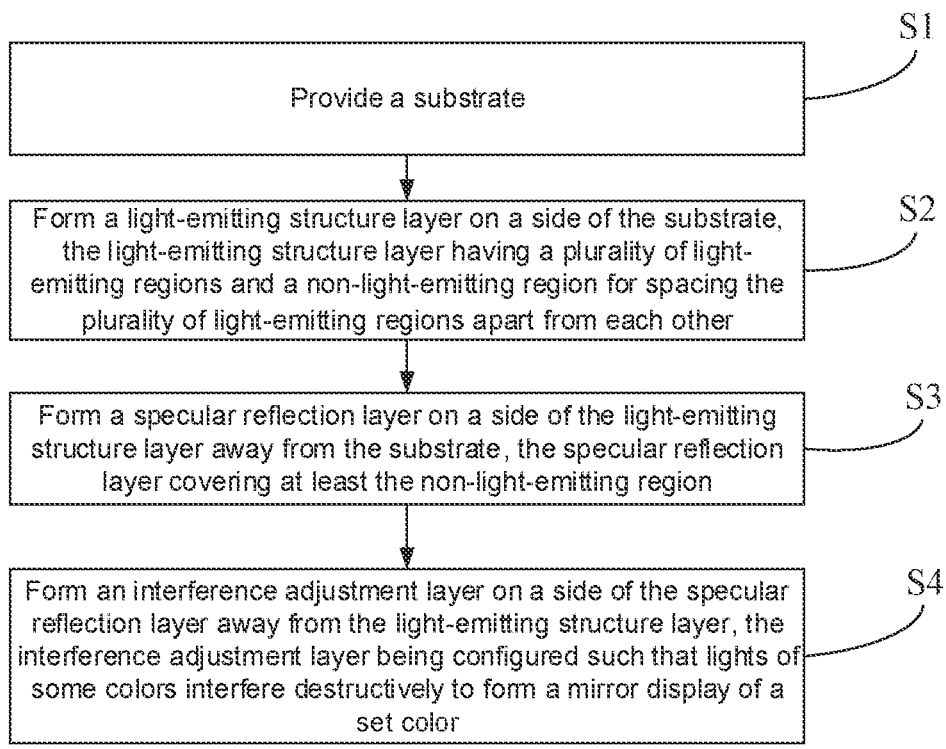
FIG. 11 is a flow diagram of a method for manufacturing a display panel, in accordance with some embodiments.

As shown in FIG. 11, some embodiments of the present disclosure provide a method for manufacturing a display panel. The method includes S1 to S4.

In S1, a substrate 10 is provided. For example, a material of the substrate 10 may include polyimide.

In S2, a light-emitting structure layer 20 is formed on a side of the substrate 10. The light-emitting structure layer 20 has a plurality of light-emitting regions 201 and a non-light-emitting region 202 for spacing the plurality of light-emitting regions 201 apart from each other.

In S3, a specular reflection layer 30 is formed on a side of the light-emitting structure layer 20 away from the substrate 10. The specular reflection layer 30 covers at least the non-light-emitting region 202.

In S4, the interference adjustment layer 40 is formed on a side of the specular reflection layer 30 away from the light-emitting structure layer 20. The interference adjustment layer 40 is configured such that lights of some colors interfere destructively to form a mirror display of a set color.

In the display panel manufactured by using the method for manufacturing the display panel in some embodiments of the present disclosure, the interference adjustment layer 40 is provided on the side of the specular reflection layer 30 away from the light-emitting structure layer 20, and the interference adjustment layer 40 may further make the lights of some colors interfere destructively. Therefore, an intensity of a light reflected by the display panel 100 is able to be effectively reduced, so that a color of the mirror display of the display panel 100 is dark, and a user is less likely to feel glare and dazzling when using the display panel 100. Moreover, the display panel 100 is further able to form the mirror display of the set color, thereby improving the fashionability of the display panel 100.

Figure 12:
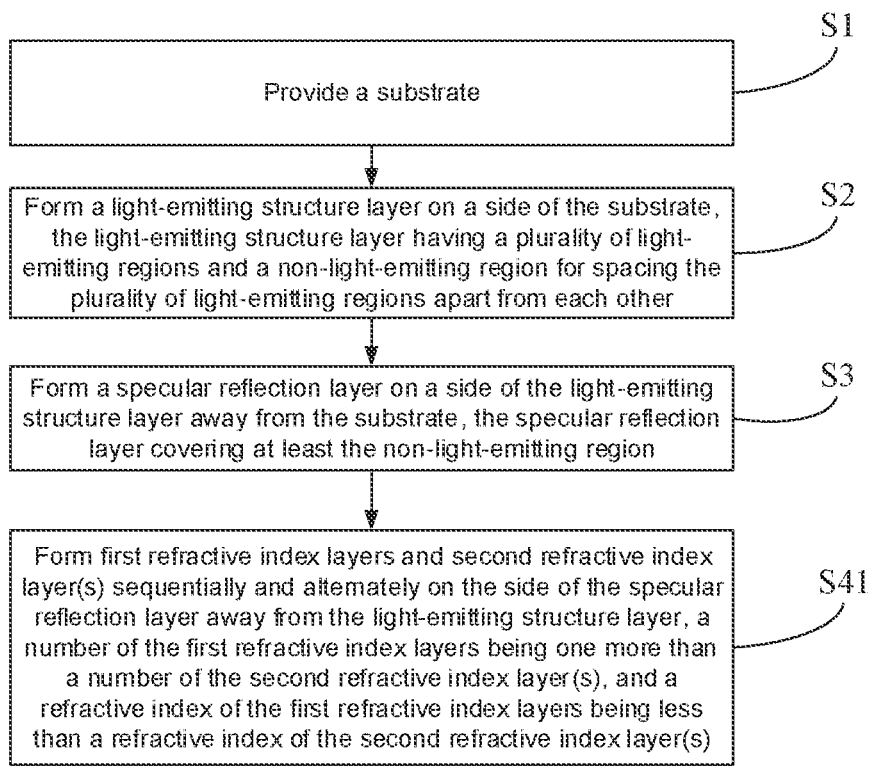
FIG. 12 is a flow diagram of another method for manufacturing a display panel, in accordance with some embodiments.

In some embodiments, as shown in FIG. 12, in S4, forming the interference adjustment layer 40 on the side of the specular reflection layer 30 away from the light-emitting structure layer 20, includes S41.

In S41, first refractive index layers 41 and second refractive index layer(s) 42 are sequentially and alternately formed on the side of the specular reflection layer 30 away from the light-emitting structure layer 20. The number of the first refractive index layers 41 is one more than the number of the second refractive index layer(s) 42. A refractive index of the first refractive index layer 41 is less than a refractive index of the second refractive index layer 42.

In this way, the second refractive index layer 42 is located between two adjacent first refractive index layers 41, and an outermost layer of the interference adjustment layer 40 is a low refractive index layer. More light irradiated from a side of the interference adjustment layer 40 away from the specular reflection layer 30 to the interference adjustment layer 40 are able to be incident into the interference adjustment layer 40. Moreover, since the interference adjustment layer 40 includes a structure in which the first refractive index layers 41 with a low refractive index and the second refractive index layer(s) 42 with a high refractive index are overlapped with each other, it is possible to make the lights of some colors interfere destructively by using the multiple-beam interference principle, so that the color of the mirror display is dark.

Figure 13:
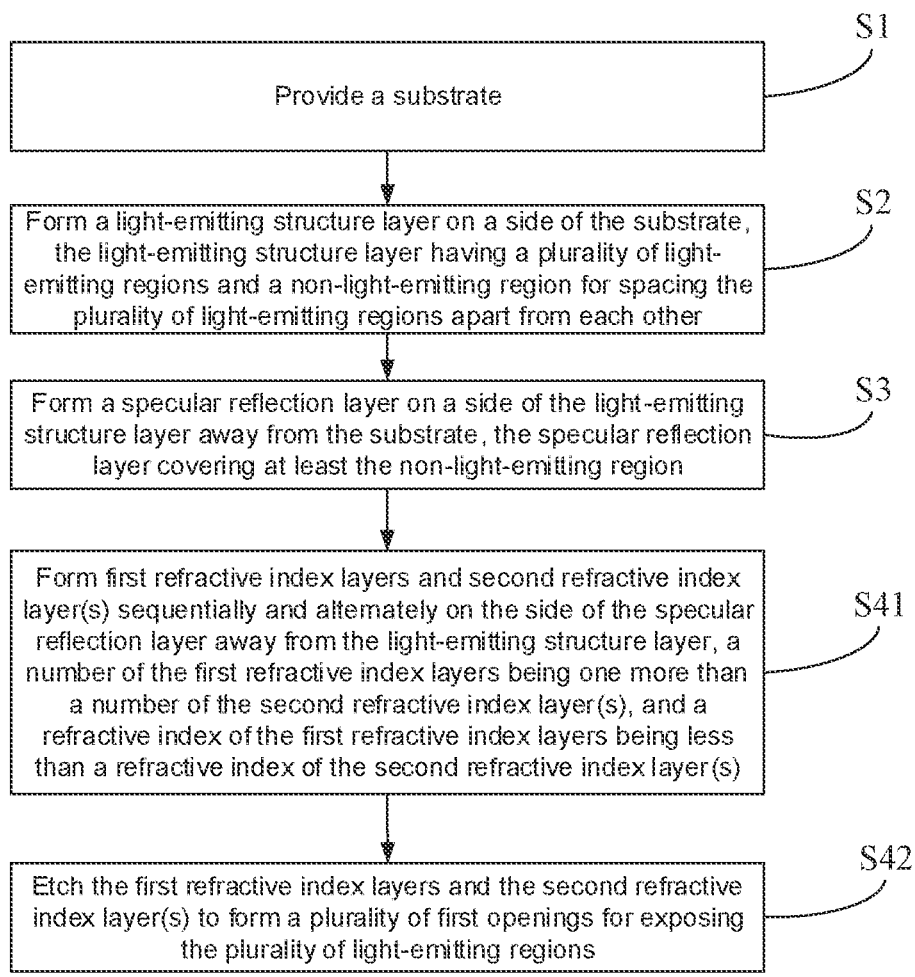
FIG. 13 is a flow diagram of yet another method for manufacturing a display panel, in accordance with some embodiments.

In some embodiments, as shown in FIG. 13, in S4, forming the interference adjustment layer 40 on the side of the specular reflection layer 30 away from the light-emitting structure layer 20, further includes S42.

In S42, all the first refractive index layers 41 and all the second refractive index layer(s) 42 are etched to form a plurality of first openings 401 for exposing the plurality of light-emitting regions 201.

Figure 14:
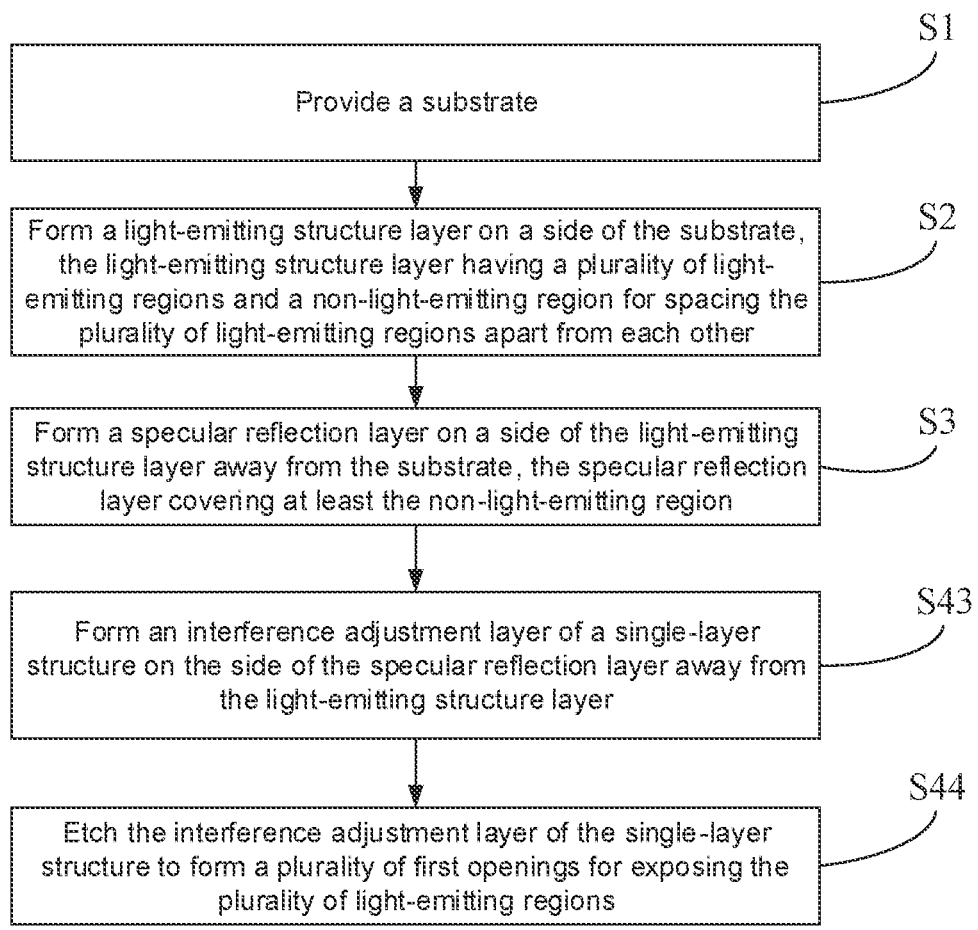
FIG. 14 is a flow diagram of yet another method for manufacturing a display panel, in accordance with some embodiments.

In some embodiments, as shown in FIG. 14, in S4, forming the interference adjustment layer 40 on the side of the specular reflection layer 30 away from the light-emitting structure layer 20, includes S43.

In S43, the interference adjustment layer 40 of a single-layer structure is formed on the side of the specular reflection layer 30 away from the light-emitting structure layer 20.

A material for forming the interference adjustment layer 40 may include at least one of tantalum metal and molybdenum oxide. Alternatively, the material for forming the interference adjustment layer 40 includes at least one of molybdenum dioxide, ferric oxide and indium oxide. Alternatively, the material for forming the interference adjustment layer 40 includes at least one of niobium carbide and zinc oxide.

For example, the thickness of the interference adjustment layer 40 may be in any one of a range of a difference between 35 nm and 5 nm to a sum of 35 nm and 5 nm (i.e., 35 nm±5 nm), a range of a difference between 45 nm and 5 nm to a sum of 45 nm and 5 nm (i.e., 45 nm±5 nm) or a range of a difference between 55 nm and 5 nm to a sum of 55 nm and 5 nm (i.e., 55 nm±5 nm). In this case, referring to FIG. 14, in S4, forming the interference adjustment layer 40 on the side of the specular reflection layer 30 away from the light-emitting structure layer 20, further includes S44.

In S44, the interference adjustment layer 40 of the single-layer structure is etched to form a plurality of first openings 401 for exposing the plurality of light-emitting regions 201.

By forming the plurality of first openings 401 in S42 or S44, when the display panel 100 drives the light-emitting devices in the light-emitting regions 201 to emit light, light emitted from the light-emitting device is able to not pass through the interference adjustment layer 40, so as to reduce an energy loss of the light emitted from the light-emitting device, thereby ensuring that the display panel 100 is able to normally display a screen when the mirror display of the set color is realized.

Figure 15:
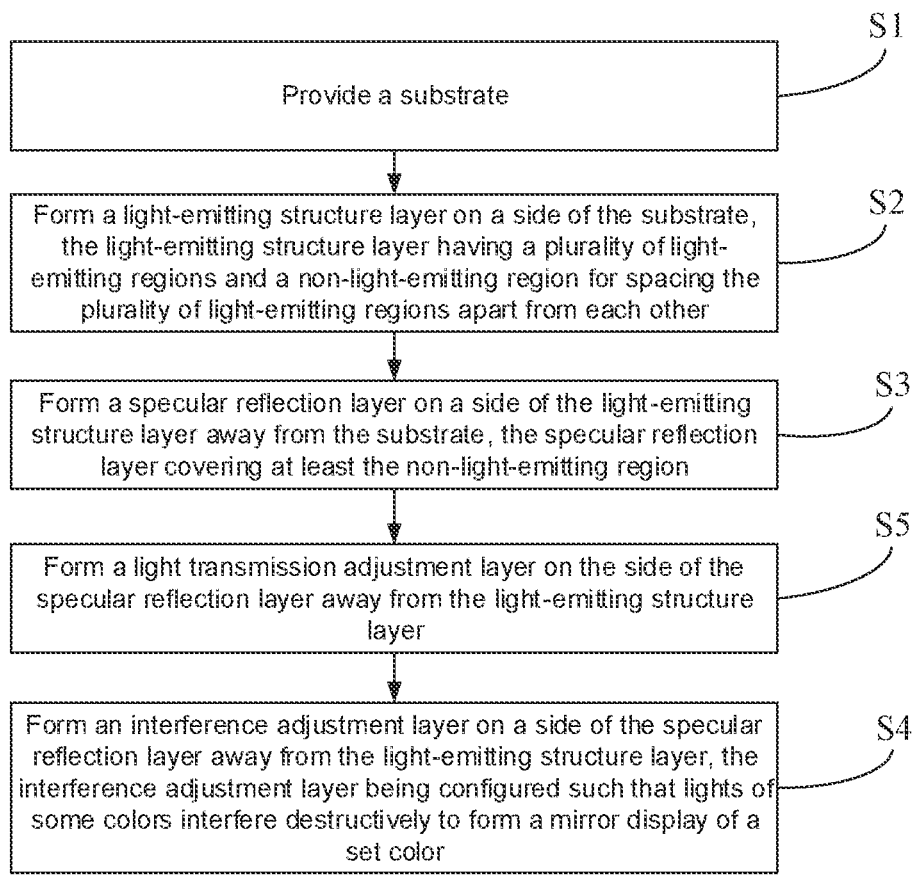
FIG. 15 is a flow diagram of yet another method for manufacturing a display panel, in accordance with some embodiments.

For example, the thickness of the interference adjustment layer 40 is in a range of a difference between 15 nm and 1 nm to a sum of 15 nm and 1 nm (i.e., 15 nm±1 nm). Based on this, as shown in FIG. 15, in S4, before forming the interference adjustment layer 40 on the side of the specular reflection layer 30 away from the light-emitting structure layer 20, the method for manufacturing the display panel further includes S5.

In S5, a light transmission adjustment layer 50 is formed on the side of the specular reflection layer 30 away from the light-emitting structure layer 20. The thickness of the light transmission adjustment layer 50 is in any one of a range of a difference between 25 nm and 2 nm to a sum of 25 nm and 2 nm (i.e., 25 nm±2 nm), a range of a difference between 33 nm and 2 nm to a sum of 33 nm and 2 nm (i.e., 33 nm±2 nm), or a range of a difference between 50 nm and 2 nm to a sum of 50 nm and 2 nm (i.e., 50 nm±2 nm).

By providing the light transmission adjustment layer 50, the thickness of the interference adjustment layer 40 is able to be reduced, and a transmittance of the interference adjustment layer 40 is able to be increased. Thus, when the display function of the display panel 100 is realized, the light emitted from the light-emitting region has small energy loss after passing through the interference adjustment layer 40. That is, the interference adjustment layer 40 has little influence on the display effect of the display panel 100. Based on this, no openings are required to be provided at respective positions of the interference adjustment layer 40 corresponding to the plurality of light-emitting regions 201, so that when the interference adjustment layer 40 is manufactured, the openings are not required to be formed by etching, which simplifies a manufacturing process of the display panel, and reduces costs.

Figure 16:
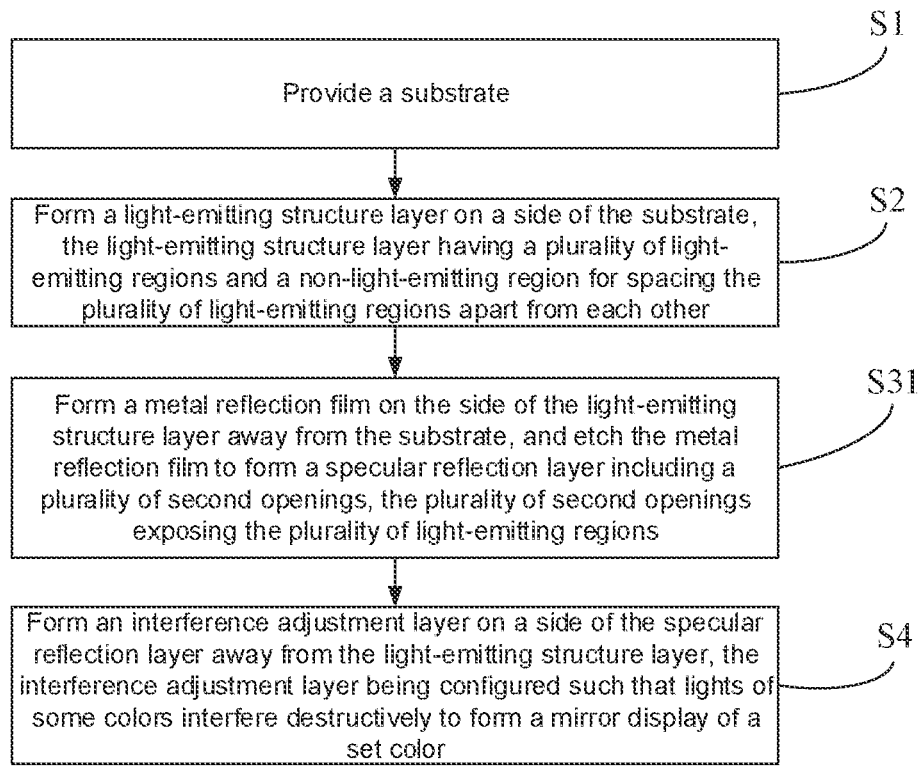
FIG. 16 is a flow diagram of yet another method for manufacturing a display panel, in accordance with some embodiments.

In some embodiments, as shown in FIG. 16, in S3, forming the specular reflection layer 30 on the side of the light-emitting structure layer 20 away from the substrate 10, includes S31.

In S31, a metal reflection film is formed on the side of the light-emitting structure layer 20 away from the substrate 10, and is etched to form a specular reflection layer 30 including a plurality of second openings 301. The plurality of second openings 301 expose the plurality of light-emitting regions 201.

In this way, not only light incident on the display panel 100 is able to be effectively reflected by using the specular reflection layer 30, but also a case that the display panel 100 cannot display normally due to the light emitted from the light-emitting region 201 being blocked by the specular reflection layer 30 is able to be avoided.

Figure 17:
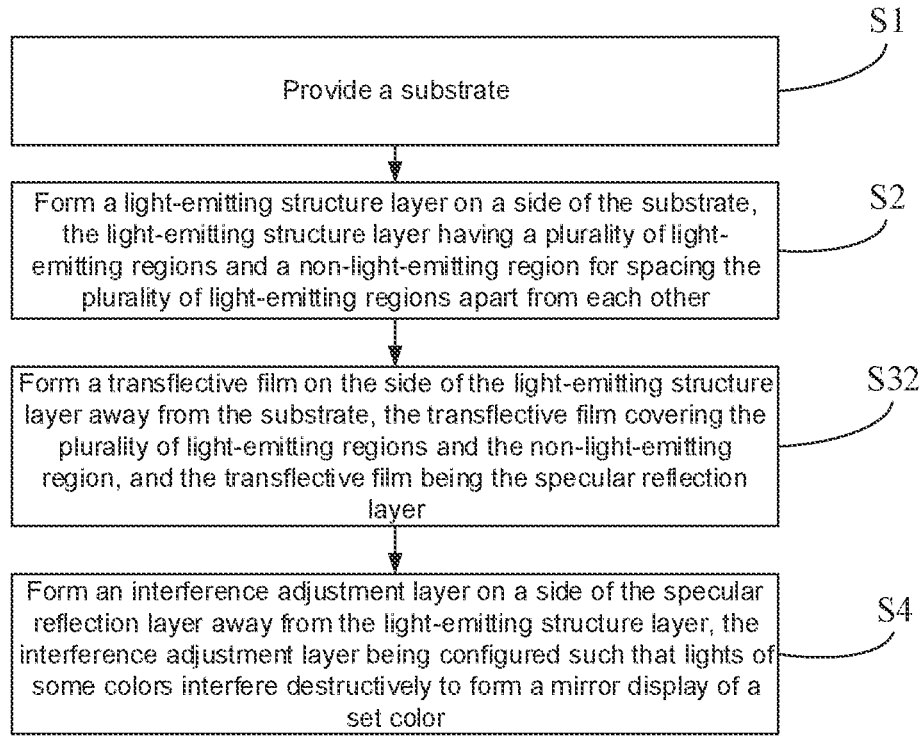
FIG. 17 is a flow diagram of yet another method for manufacturing a display panel, in accordance with some embodiments.

Alternatively, in some other embodiments, as shown in FIG. 17, in S3, forming the specular reflection layer 30 on the side of the light-emitting structure layer 20 away from the substrate 10, includes S32.

In S32, a transflective film is formed on the side of the light-emitting structure layer 20 away from the substrate 10. The transflective film covers the plurality of light-emitting regions 201 and the non-light-emitting region 202, and the transflective film is the specular reflection layer 30.

In this way, the light emitted from the light-emitting region 201 may pass through the specular reflection layer 30 to exit. Therefore, no openings are required to be provided in the specular reflection layer 30, thereby simplifying a manufacturing process of the specular reflection layer 30, saving time, and reducing manufacturing costs.

Figure 18:
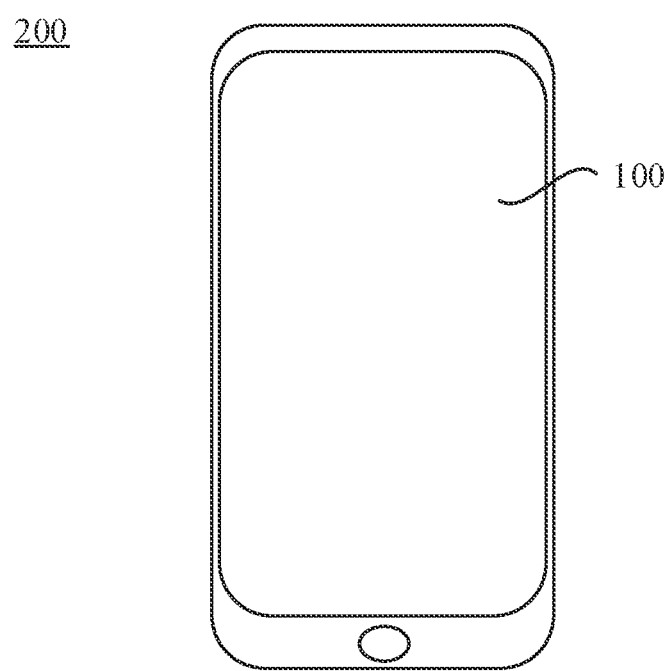
FIG. 18 is a structural diagram of a display device, in accordance with some embodiments.

As shown in FIG. 18, some embodiments of the present disclosure provide a display device 200 including the display panel 100 in any one of the above embodiments.

The display device may be an organic light-emitting diode (OLED) display device or a quantum dot light-emitting diode (QLED) display device.

The display device may be any component with a display function, such as a TV, a digital camera, a mobile phone, a watch, a tablet computer, a notebook computer, or a navigator.

Beneficial effects that the display device is able to realize are the same as those of the display panel in the above technical solutions, and will not be repeated here.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
a substrate;
a light-emitting structure layer located on a side of the substrate; the light-emitting structure layer having a plurality of light-emitting regions and a non-light-emitting region for spacing the plurality of light-emitting regions apart from each other;
a specular reflection layer located on a side of the light-emitting structure layer away from the substrate; the specular reflection layer covering at least the non-light-emitting region; and
an interference adjustment layer located on a side of the specular reflection layer away from the light-emitting structure layer; the interference adjustment layer being configured such that lights of some colors interfere destructively to form a mirror display of a set color.

2. The display panel according to claim 1, wherein the interference adjustment layer includes:
at least two first refractive index layers that are stacked; and
a second refractive index layer located between every two adjacent first refractive index layers; a refractive index of the second refractive index layer being greater than a refractive index of the first refractive index layers.

3. The display panel according to claim 2, wherein a material of the first refractive index layers includes silicon dioxide or magnesium fluoride; and/or
a material of the second refractive index layer includes metal.

4. The display panel according to claim 2, wherein a thickness of the first refractive index layers is in any one of a range of a difference between 135 nm and 5 nm to a sum of 135 nm and 5 nm, a range of a difference between 155 nm and 5 nm to a sum of 155 nm and 5 nm, a range of a difference between 170 nm and 5 nm to a sum of 170 nm and 5 nm, a range of a difference between 195 nm and 5 nm to a sum of 195 nm and 5 nm, a range of a difference between 210 nm and 5 nm to a sum of 210 nm and 5 nm, a range of a difference between 225 nm and 5 nm to a sum of 225 nm and 5 nm or a range of a difference between 240 nm and 5 nm to a sum of 240 nm and 5 nm; and
a thickness of the second refractive index layer is in a range of a difference between 4 nm and 1 nm to a sum of 4 nm and 1 nm.

5. The display panel according to claim 1, wherein the interference adjustment layer is of a single-layer structure; wherein
a material of the interference adjustment layer includes at least one of tantalum metal and molybdenum oxide; or a material of the interference adjustment layer includes at least one of molybdenum dioxide, ferric oxide and indium oxide; or a material of the interference adjustment layer includes at least one of niobium carbide and zinc oxide.

6. The display panel according to claim 5, wherein the interference adjustment layer is configured such that for a light with a wavelength of 550 nm, a refractive index of the interference adjustment layer is in a range of 2.3 to 2.6, inclusive, and an extinction coefficient of the interference adjustment layer is in a range of 0.57 to 0.77, inclusive.

7. The display panel according to claim 5, wherein a thickness of the interference adjustment layer is in any one of a range of a difference between 35 nm and 5 nm to a sum of 35 nm and 5 nm, a range of a difference between 45 nm and 5 nm to a sum of 45 nm and 5 nm or a range of a difference between 55 nm and 5 nm to a sum of 55 nm and 5 nm.

8. The display panel according to claim 5, wherein a thickness of the interference adjustment layer is in a range of a difference between 15 nm and 1 nm to a sum of 15 nm and 1 nm; and the display panel further comprises:
a light transmission adjustment layer located between the specular reflection layer and the interference adjustment layer, a thickness of the light transmission adjustment layer being in any one of a range of a difference between 25 nm and 2 nm to a sum of 25 nm and 2 nm, a range of a difference between 33 nm and 2 nm to a sum of 33 nm and 2 nm, or a range of a difference between 50 nm and 2 nm to a sum of 50 nm and 2 nm.

9. The display panel according to claim 1, wherein the interference adjustment layer includes a plurality of first openings for exposing the plurality of light-emitting regions.

10. The display panel according to claim 1, wherein a thickness of the specular reflection layer is in a range of a difference between 330 nm and 5 nm to a sum of 330 nm and 5 nm.

11. The display panel according to claim 1, wherein the specular reflection layer is a transflective layer, and the specular reflection layer further covers the plurality of light-emitting regions; or the specular reflection layer is a metal reflection layer, and the metal reflection layer includes a plurality of second openings for exposing the plurality of light-emitting regions.

12. The display panel according to claim 1, further comprising:
an encapsulation layer located between the light-emitting structure layer and the specular reflection layer; the encapsulation layer being configured to encapsulate the light-emitting structure layer on the substrate;
a protective cover plate located on a side of the interference adjustment layer away from the specular reflection layer, the protective cover plate being configured to protect the interference adjustment layer, the specular reflection layer and the light-emitting structure layer; and
an optical adhesive layer located between the interference adjustment layer and the protective cover plate; the optical adhesive layer being configured to adhere the protective cover plate to a surface of the interference adjustment layer away from the specular reflection layer.

13. A display device, comprising:
the display panel according to claim 1.

14. A method for manufacturing a display panel, comprising:
providing a substrate;
forming a light-emitting structure layer on a side of the substrate, the light-emitting structure layer having a plurality of light-emitting regions and a non-light-emitting region for spacing the plurality of light-emitting regions apart from each other;
forming a specular reflection layer on a side of the light-emitting structure layer away from the substrate, the specular reflection layer covering at least the non-light-emitting region; and
forming an interference adjustment layer on a side of the specular reflection layer away from the light-emitting structure layer, the interference adjustment layer being configured such that lights of some colors interfere destructively to form a mirror display of a set color.

15. The method for manufacturing the display panel according to claim 14, wherein forming the interference adjustment layer on the side of the specular reflection layer away from the light-emitting structure layer, includes:
forming first refractive index layers and at least one second refractive index layer sequentially and alternately on the side of the specular reflection layer away from the light-emitting structure layer, a number of the first refractive index layers being one more than a number of the at least one second refractive index layer, and a refractive index of the first refractive index layers being less than a refractive index of the at least one second refractive index layer.

16. The method for manufacturing the display panel according to claim 15, wherein forming the interference adjustment layer on the side of the specular reflection layer away from the light-emitting structure layer, further includes:
etching the first refractive index layers and the at least one second refractive index layer to form a plurality of first openings for exposing the plurality of light-emitting regions.

17. The method for manufacturing the display panel according to claim 14, wherein forming the interference adjustment layer on the side of the specular reflection layer away from the light-emitting structure layer, includes:
forming an interference adjustment layer of a single-layer structure on the side of the specular reflection layer away from the light-emitting structure layer; wherein
a material for forming the interference adjustment layer includes at least one of tantalum metal and molybdenum oxide; or a material for forming the interference adjustment layer includes at least one of molybdenum dioxide, ferric oxide and indium oxide; or a material for forming the interference adjustment layer includes at least one of niobium carbide and zinc oxide.

18. The method for manufacturing the display panel according to claim 17, wherein a thickness of the interference adjustment layer is in any one of a range of a difference between 35 nm and 5 nm to a sum of 35 nm and 5 nm, a range of a difference between 45 nm and 5 nm to a sum of 45 nm and 5 nm or a range of a difference between 55 nm and 5 nm to a sum of 55 nm and 5 nm;
forming the interference adjustment layer on the side of the specular reflection layer away from the light-emitting structure layer, further includes:
etching the interference adjustment layer of the single-layer structure to form a plurality of first openings for exposing the plurality of light-emitting regions.

19. The method for manufacturing the display panel according to claim 17, wherein a thickness of the interference adjustment layer is in a range of a difference between 15 nm and 1 nm to a sum of 15 nm and 1 nm; before forming the interference adjustment layer on the side of the specular reflection layer away from the light-emitting structure layer, the method for manufacturing the display panel further comprises:
forming a light transmission adjustment layer on the side of the specular reflection layer away from the light-emitting structure layer, a thickness of the light transmission adjustment layer being in any one of a range of a difference between 25 nm and 2 nm to a sum of 25 nm and 2 nm, a range of a difference between 33 nm and 2 nm to a sum of 33 nm and 2 nm, or a range of a difference between 50 nm and 2 nm to a sum of 50 nm and 2 nm.

20. The method for manufacturing the display panel according to claim 14, wherein forming the specular reflection layer on the side of the light-emitting structure layer away from the substrate, includes:

forming a metal reflection film on the side of the light-emitting structure layer away from the substrate, and etching the metal reflection film to form a specular reflection layer including a plurality of second openings, the plurality of second openings exposing the plurality of light-emitting regions; or forming a transflective film on the side of the light-emitting structure layer away from the substrate, the transflective film covering the plurality of light-emitting regions and the non-light-emitting region, and the transflective film being the specular reflection layer.

* * * * *